(12) United States Patent
Larimore

(10) Patent No.: US 10,417,353 B2
(45) Date of Patent: Sep. 17, 2019

(54) METHOD AND SYSTEM OF DYNAMIC MODEL IDENTIFICATION FOR MONITORING AND CONTROL OF DYNAMIC MACHINES WITH VARIABLE STRUCTURE OR VARIABLE OPERATION CONDITIONS

(71) Applicant: Wallace Larimore, McLean, VA (US)

(72) Inventor: Wallace Larimore, McLean, VA (US)

( * ) Notice: Subject to any disclaimer, the term of this patent is extended or adjusted under 35 U.S.C. 154(b) by 820 days.

(21) Appl. No.: 14/305,331

(22) Filed: Jun. 16, 2014

(65) Prior Publication Data

US 2014/0372091 A1 Dec. 18, 2014

Related U.S. Application Data

(60) Provisional application No. 61/835,129, filed on Jun. 14, 2013.

(51) Int. Cl.
*G05B 17/02* (2006.01)
*G06F 17/50* (2006.01)

(52) U.S. Cl.
CPC .......... *G06F 17/5009* (2013.01); *G05B 17/02* (2013.01)

(58) Field of Classification Search
CPC .................. G06F 17/5009; G05B 17/02
USPC ............................................. 703/2
See application file for complete search history.

(56) References Cited

U.S. PATENT DOCUMENTS

| | | | |
|---|---|---|---|
| 6,349,272 B1 | 2/2002 | Phillips | |
| 6,737,969 B2 | 5/2004 | Carlson et al. | |
| 2004/0181498 A1* | 9/2004 | Kothare | G05B 17/02 706/45 |
| 2005/0021319 A1 | 1/2005 | Li et al. | |
| 2011/0054863 A1 | 3/2011 | Larimore | |
| 2014/0060506 A1* | 3/2014 | Shaver | F02D 13/0226 123/672 |

FOREIGN PATENT DOCUMENTS

| | | |
|---|---|---|
| CN | 101587328 A | 11/2009 |
| CN | 102667755 A | 9/2012 |
| CN | 102955428 A | 3/2013 |
| CN | 103064282 A | 4/2013 |
| EP | 1 464 035 A1 | 10/2004 |
| JP | H11-235907 A | 8/1999 |
| JP | 2010-503926 A | 2/2010 |

(Continued)

OTHER PUBLICATIONS

Bolea, Yolanda and Chefdor, Nicolas and Grau, Antoni. MIMO LPV State-Space Identification of Open-Flow Irrigation Canal Systems. Mathematical Problems in Engineering, vol. 2012. pp. 1-17. DOI:10.1155/2012/948936.*

(Continued)

*Primary Examiner* — Kamini S Shah
*Assistant Examiner* — John E Johansen
(74) *Attorney, Agent, or Firm* — Maier & Maier, PLLC

(57) ABSTRACT

A method and system for forming a dynamic model for the behavior of machines from sensed data. The method and system generates a dynamic model of the machine by applying a canonical variate analysis (CVA) method to subspace system identification extending to parameter varying (LPV) systems and nonlinear (NL) systems in order to make implementation of the computation feasible and accurate.

15 Claims, 8 Drawing Sheets

(56) References Cited

FOREIGN PATENT DOCUMENTS

| JP | 2013-504133 A | 2/2013 |
| KR | 1020120092588 A | 8/2012 |
| WO | 03/046855 A1 | 6/2003 |
| WO | 2008/033800 A2 | 3/2008 |

OTHER PUBLICATIONS

De Caigny, Jan and Camino, Juan and Swevers, Jan. Identification of MIMO LPV models based on interpolation. Proceedings of ISMA2008. pp. 2631-2644.*

Luigi del Re. Automotive Model Predictive Control. Lecture Notes in Control and Information Sciences 402. Springer-Verlag Berlin Heidelberg, 2010. p. 5,114. ISBN 978-1-84996-070-0.*

Olsson, Claes. Disturbance Observer-Based Automotive Engine Vibration Isolation Dealing With Non-linear Dynamics and Transient Excitation. In: Technical Report, Department of Information Technology, Uppsala University, No. 2005009. Apr. 22, 2005.*

Palanthandalam-Madapusi, Harish J., et al. "Subspace-based identification for linear and nonlinear systems." American Control Conference, 2005. Proceedings of the 2005. IEEE, 2005. pp. 3220-2334.*

Reynders, Edwin. "System identification methods for (operational) modal analysis: review and comparison." Archives of Computational Methods in Engineering 19.1 (2012): pp. 51-124.*

Olsson, Claes. Disturbance Observer-Based Automotive Engine Vibration Isolation Dealing With Non-linear Dynamics and Transient Excitation. In: Technical Report, Department of Information Technology, Uppsala University, No. 2005009. Apr. 22, 2005. pp. 1-29.*

Palanthandalam-Madapusi, Harish J., et al. "Subspace-based identification for linear and nonlinear systems." American Control Conference, 2005. Proceedings of the 2005. IEEE, 2005. pp. 3220-2334. (Year: 2005).*

Reynders, Edwin. "System identification methods for (operational) modal analysis: review and comparison." Archives of Computational Methods in Engineering 19.1 (2012): pp. 51-124. (Year: 2012).*

Olsson, Claes. Disturbance Observer-Based Automotive Engine Vibration Isolation Dealing With Non-linear Dynamics and Transient Excitation. In: Technical Report, Department of Information Technology, Uppsala University, No. 2005009. Apr. 22, 2005. pp. 1-29. (Year: 2005).*

P. Lopes Dos Santos et al; Identification of Linear Parameter Varying Systems Using an Iterative Deterministic-Stochastic Subspace Approach; pp. 4867-4873; Proceedings of the European Control Conference 2007; Kos, Greece; Jul. 2-5, 2007.

Vincent Verdult et al.; Identification of Multivariable Linear Parameter-Varying Systems Based on Subspace Techniques; Proceedings of the 39th IEEE Conference and Decision and Control; Sydney, Australia; Dec. 2000; pp. 1567-1572.

International Search Report and Written Opinion dated Oct. 10, 2014 from corresponding International Patent Application No. PCT/US2014/042486; 9 pgs.

Wallace E Larimore et al.; ADAPT-Ipv Software for Identification of Nonlinear Parameter-Varying Systems; 16th IFAC Symposium on System Identification; The International Federation of Automatic Control; Jul. 11, 2012; pp. 1820-1825.

Office Action dated Jul. 10, 2018 in corresponding Japanese Application No. 2016-519708; 9 pages.

Chinese Office Action dated Apr. 2, 2018, in connection with corresponding CN Application No. 201480045012.4 (13 pgs., including English translation).

Chinese Office Action dated Dec. 28, 2018, in connection with corresponding CN Application No. 201480045012.4 (13 pgs., including machine-generated English translation).

Japanese Office Action dated May 14, 2019, in connection with corresponding JP Application No. 2016-519708 (9 pgs., including English translation).

Office Action dated Jul. 1, 2019 in corresponding Chinese Application No. 201480045012.4; 11 pages including English-language translation.

* cited by examiner

Fig. 3

| Machine Data | Machine Dynamic Model |
|---|---|
| • Can be high-dimensional, with considerable noise | • Near optimal (Maximum Likelihood Lower Bound) accuracy<br>• For large samples, the number of estimated parameters is near the minimal number corresponding to the true model order<br>• Model accuracy RMS is proportional to number of estimated parameters<br>• For the LTI problem with no inputs and Gaussian noise, CVA approaches the Lower Bound for large sample size, and is among 3 subspace methods that have minimum variance in the presence of feedback for large samples<br>• Rank selection using CVA and AIC approaches optimal order, and structure selection is optimal as measured by Kullback information<br>• Accuracy of subsequent monitoring, filtering and control procedures have accuracy largely determined by the statistical properties of the CVA-(N)LPV Realization method<br>• In summary, enables the direct implementation of high accuracy analysis of dynamics, filtering of noisy dynamic variables, accurate monitoring and fault detection, and high accuracy control or modification of the machine dynamic response characteristics |
| 302 | 304 |

METHOD AND SYSTEM OF DYNAMIC MODEL IDENTIFICATION FOR MONITORING AND CONTROL OF DYNAMIC MACHINES WITH VARIABLE STRUCTURE OR VARIABLE OPERATION CONDITIONS

BACKGROUND

The modeling of nonlinear and time-varying dynamic processes or systems from measured output data and possibly input data is an emerging area of technology. Depending on the area of theory or application, it may be called time series analysis in statistics, system identification in engineering, longitudinal analysis in psychology, and forecasting in financial analysis.

In the past there has been the innovation of subspace system identification methods and considerable development and refinement including optimal methods for systems involving feedback, exploration of methods for nonlinear systems including bilinear systems and linear parameter varying (LPV) systems. Subspace methods can avoid iterative nonlinear parameter optimization that may not converge, and use numerically stable methods of considerable value for high order large scale systems.

In the area of time-varying and nonlinear systems there has been work undertaken, albeit without the desired results. The work undertaken was typical of the present state of the art in that rather direct extensions of linear subspace methods are used for modeling nonlinear systems. This approach expresses the past and future as linear combinations of nonlinear functions of past inputs and outputs. One consequence of such an approach is that the dimension of the past and future expand exponentially in the number of measured inputs, outputs, states, and lags of the past that are used. When using only a few of each of these variables, the dimension of the past can number over $10^4$ or even more than $10^6$. For typical industrial processes, the dimension of the past can easily exceed $10^9$ or even $10^{12}$. Such extreme numbers result in inefficient exploitation and results, at best.

Other techniques use an iterative subspace approach to estimating the nonlinear terms in the model and as a result require very modest computation. The iterative approach involves a heuristic algorithm, and has been used for high accuracy model identification in the case of LPV systems with a random scheduling function, i.e. with white noise characteristics. One of the problems, however, is that in most LPV systems the scheduling function is usually determined by the particular application, and is often very non-random in character. In several modifications that have been implemented to attempt to improve the accuracy for the case of nonrandom scheduling functions, the result is that the attempted modifications did not succeed in substantially improving the modeling accuracy.

In a more general context, the general problem of identification of nonlinear systems is known as a general nonlinear canonical variate analysis (CVA) procedure. The problem was illustrated with the Lorenz attractor, a chaotic nonlinear system described by a simple nonlinear difference equation. Thus nonlinear functions of the past and future are determined to describe the state of the process that is, in turn used to express the nonlinear state equations for the system. One major difficulty in this approach is to find a feasible computational implementation since the number of required nonlinear functions of past and future expand exponentially as is well known. This difficulty has often been encountered in finding a solution to the system identification problem that applies to general nonlinear systems.

Thus, in some exemplary embodiments described below, methods and systems may be described that can achieve considerable improvement and also produce optimal results in the case where a 'large sample' of observations is available. In addition, the method is not 'ad hoc' but can involve optimal statistical methods.

SUMMARY

A method and system for forming a dynamic model for the behavior of machines from sensed data. The method and system can include observing, with at least one sensor, a machine in operation; recording data from the at least one sensor about at least one characteristic of the machine in operation; fitting an input-output N(ARX)-LPV dynamic model to the recorded machine data; utilizing a CVA-(N)LPV realization method on the dynamic model; constructing a dynamic state space (N)LPV dynamic model based on the utilization of the CVA-(N)LPV realization method; generating a dynamic model of machine behavior; and at least one of controlling and modifying machine dynamic response characteristics based upon the generated dynamic model of machine behavior.

BRIEF DESCRIPTION OF THE FIGURES

Advantages of embodiments of the present invention will be apparent from the following detailed description of the exemplary embodiments thereof, which description should be considered in conjunction with the accompanying drawings in which like numerals indicate like elements, in which:

FIG. 3 is an exemplary diagram showing advantages of a Machine Dynamic Model compared to the Machine Data.

DESCRIPTION OF INVENTION

Figure 1:
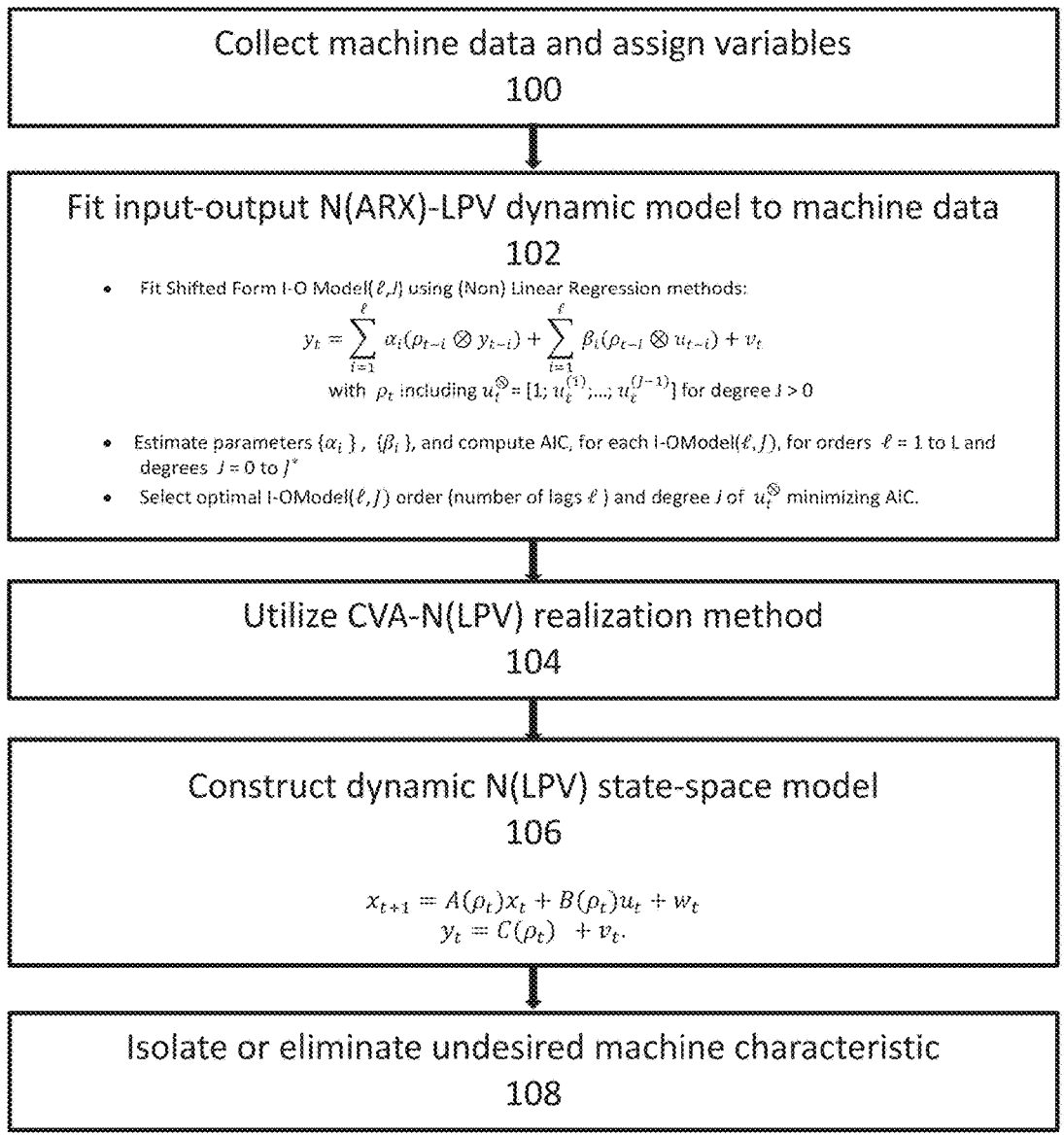
FIG. 1 is an exemplary diagram showing steps for transforming machine data to a state space dynamic model of the machine.

Aspects of the present invention are disclosed in the following description and related figures directed to specific embodiments of the invention. Those skilled in the art will recognize that alternate embodiments may be devised without departing from the spirit or the scope of the claims. Additionally, well-known elements of exemplary embodiments of the invention will not be described in detail or will be omitted so as not to obscure the relevant details of the invention.

As used herein, the word "exemplary" means "serving as an example, instance or illustration." The embodiments described herein are not limiting, but rather are exemplary only. It should be understood that the described embodiments are not necessarily to be construed as preferred or advantageous over other embodiments. Moreover, the terms "embodiments of the invention", "embodiments" or "invention" do not require that all embodiments of the invention include the discussed feature, advantage or mode of operation. Further, absolute terms, such as "need", "require", "must", and the like shall be interpreted as non-limiting and used for exemplary purposes only.

Further, many of the embodiments described herein are described in terms of sequences of actions to be performed by, for example, elements of a computing device. It should be recognized by those skilled in the art that the various sequences of actions described herein can be performed by specific circuits (e.g. application specific integrated circuits (ASICs)) and/or by program instructions executed by at least one processor. Additionally, the sequence of actions described herein can be embodied entirely within any form of computer-readable storage medium such that execution of the sequence of actions enables the at least one processor to perform the functionality described herein. Furthermore, the sequence of actions described herein can be embodied in a combination of hardware and software. Thus, the various aspects of the present invention may be embodied in a number of different forms, all of which have been contemplated to be within the scope of the claimed subject matter. In addition, for each of the embodiments described herein, the corresponding form of any such embodiment may be described herein as, for example, "a computer configured to" perform the described action.

The following materials, included herein as non-limiting examples, describe some exemplary embodiments of a method and system for identification of nonlinear parameter-varying systems via canonical variate analysis. Additionally, a further exemplary embodiment describing subspace identification of an aircraft linear parameter-varying flutter model may be described. Additionally, all of these exemplary embodiments included references, cited herein, which are incorporated by reference in their entirety. Various implementations of these methods and systems may be implemented on various platforms and may include a variety of applications and physical implementations.

Generally referring to FIGS. 1-15, it may be desirable to parameterize machine dynamics using parameters of machine structure and operating conditions that are directly measured, such as combustion engine speed in revolutions per minute (RPM) or aircraft speed and altitude. This data may be collected in any of a variety of fashions. For example, any desired probes or sensors may be used to collect and transmit data to a database, where it may be compared and analyzed. For example, using such data, a dynamic model that is parameterized over machine structures and operating conditions may be constructed. In general, the structure and/or operating point parameters can vary, even varying rapidly, which may not affect the dynamic model, but which can present a more difficult mathematical problem to solve. The results of such a mathematical problem, however, can apply to a broad range of variable structure machines and/or changing constant conditions. Such an approach, as utilized herein, can have an advantage over prior slowly changing "constant" models because those models fail to get measurements at every set of points in a parameterized space and cannot provide information at points other than those which a machine under analysis actually visits or encounters. The exemplary embodiments described herein can provide a highly accurate mathematically valid interpolation method and system.

In one exemplary embodiment, a general method and system for obtaining a dynamic model from a set of data which may include outputs and inputs together with machine structure and operation conditions may be referred to as a realization method or algorithm. It may further be viewed as a transformation on observed data about the machine state and operating condition to a dynamic model describing the machine behavior that can entail various combinations of machine structure, operating conditions, past outputs and inputs, and any resulting future outputs so as to be able to predict future behavior with some fidelity. In a linear time-invariant (LTI) case where there may only be one machine structure and a fixed operating condition, the problem may be reliably solved using subspace system identification methods using singular value decomposition (SVD) methods.

In other situations, a more general problem involving machines with variable structure and variable operating conditions may only involve very small scale problems, sometimes involving extensions of subspace methods. One problem may be that the computational requirements may grow exponentially with the problem size, for example the number of system inputs, outputs, state variables, and operating parameters, so as to exclude the solution of many current practical problems for which solutions are desired. Therefore, in one exemplary embodiment described herein, a realization method and system with computation requirements that may grow only as the cube of a size of a problem may be utilized, for example, similar to an LTI case used on large scale problems.

In such embodiments, a detailed modeling of the dynamics of machines with variable structure and variable operating conditions may be achieved. Such detailed dynamic models may, in turn, allow for analysis of the dynamic structure, construction of estimators and filters, monitoring and diagnosis of system changes and faults, and construction of global controllers for controlling and modifying the behavior of these machines. Thus, exemplary embodiments described herein can transform a set of data from a dynamic machine that often contains substantial noise to an augmented machine with dynamic behavior that can be precisely quantified. This can allow for an accurate estimation of otherwise noisy variables, the ability to monitor the dynamics for changes and faults, and the ability to change the dynamic behavior using advanced control methods. Further, such exemplary embodiments can transform machine data to a dynamic model description in state space form characterizing its dynamic behavior and then using such a dynamic model to enable it with a collection of distinctly different functions, for example estimation and filtering of random variables, monitoring, failure detection, and control. Exemplary applications of embodiments described herein may be with combustion engines, distillation processes, and/or supersonic transport that can involve very specific and observable natural phenomena as embodied in the measured data of outputs and possibly inputs, along with data describing the variation of machine structure and operating conditions.

Further embodiments described herein can give examples of a canonical variate analysis (CVA) method of subspace system identification for linear time-invariant (LTI), linear parameter-varying (LPV), and nonlinear parameter-varying (NLPV) systems. The embodiments described herein can take a first principles statistical approach to rank determination of deterministic vectors using a singular value decomposition (SVD), followed by a statistical multivariate CVA as rank constrained regression. This can then be generalized to LTI dynamic systems, and extended directly to LPV and NLPV systems. The computational structure and problem size may be similar to LTI subspace methods except that the matrix row dimension (number of lagged variables of the past) can be multiplied by the effective number of parameter-varying functions. This is in contrast with the exponential explosion in the number of variables using current subspace methods for LPV systems. Compared with current methods, results using the embodiments described herein indicate much less computation, maximum likelihood accuracy, and better numerical stability. The method and system apply to systems with feedback, and can automatically remove a number of redundancies in the nonlinear models producing near minimal state orders and polynomial degrees by hypothesis testing.

The identification of these systems can involve either nonlinear iterative optimization methods with possible problems of local minima and numerical ill-conditioning, or involves subspace methods with exponentially growing computations and associated growing numerical inaccuracy as problem size increases linearly in state dimension. There has been considerable clarification of static and dynamic dependence in transformations between model forms that plays a major role in the CVA identification of LPV and nonlinear models.

The new methods and systems described herein are called CVA-LPV because of their close relationship to the subspace CVA method for LTI systems. As is well known, the solution of the LPV system identification problem can provide a gateway to much more complex nonlinear systems including bilinear systems, polynomial systems, and systems involving any known nonlinear functions of known variables or operating conditions, often called scheduling functions, that are in affine (additive) form.

Figure 2:
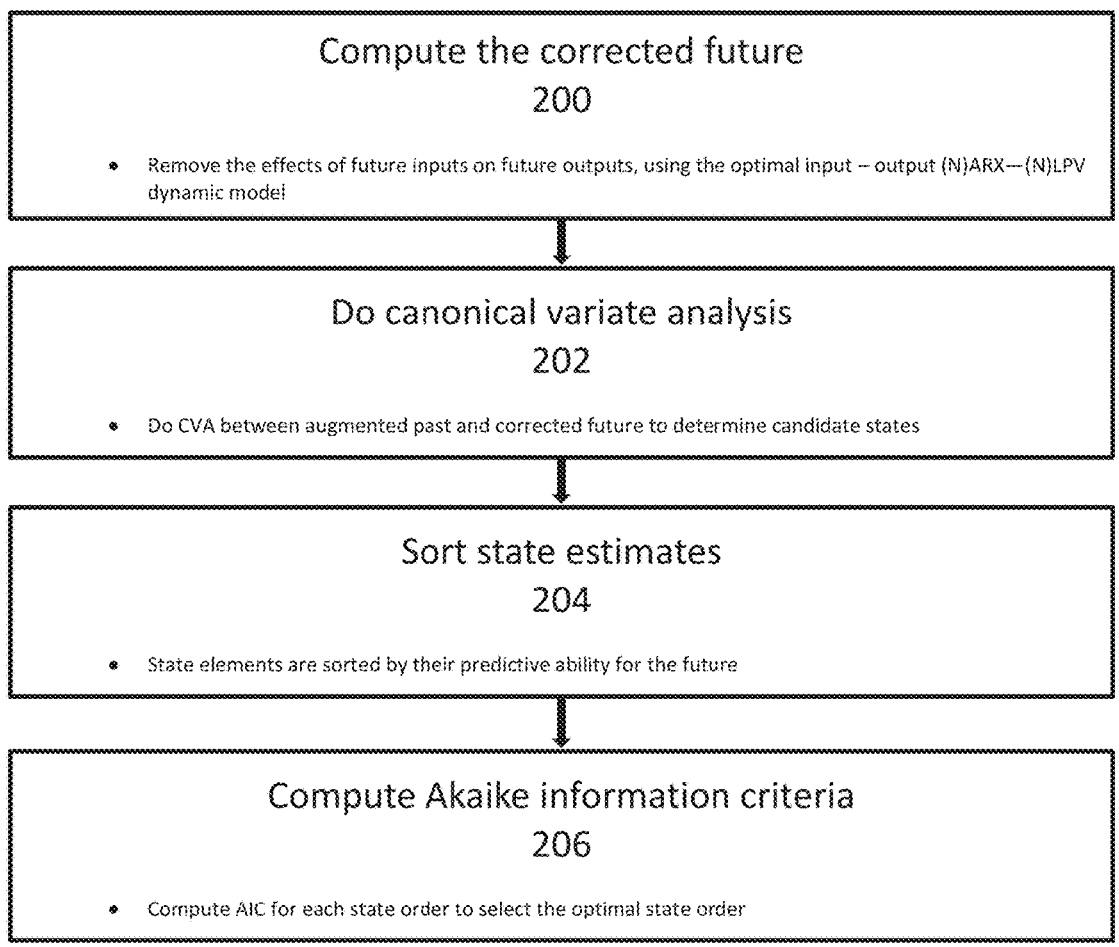
FIG. 2 is an exemplary diagram showing the steps in a CVA-(N)LPV Realization Method.
Figure 4:
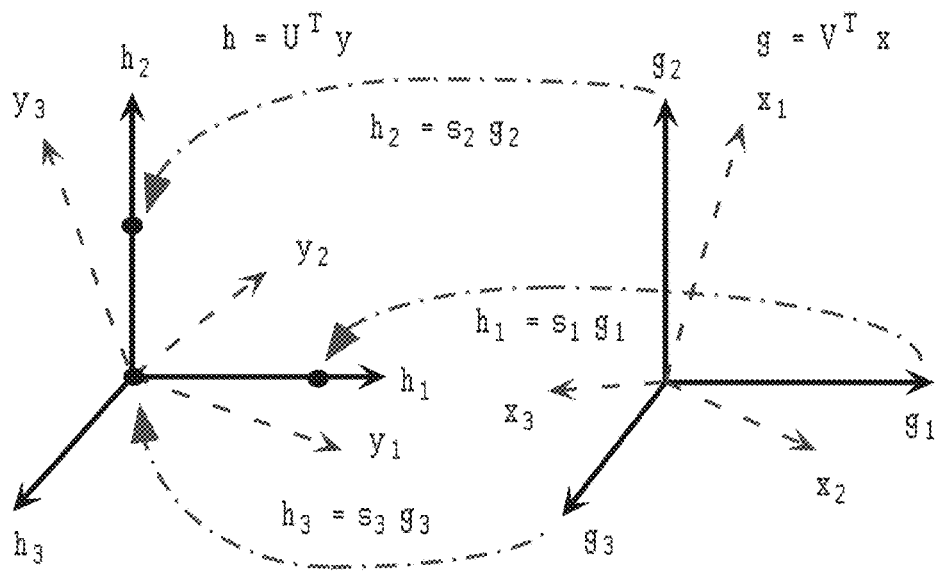
FIG. 4 is an exemplary diagram showing a singular value decomposition
Figure 5:
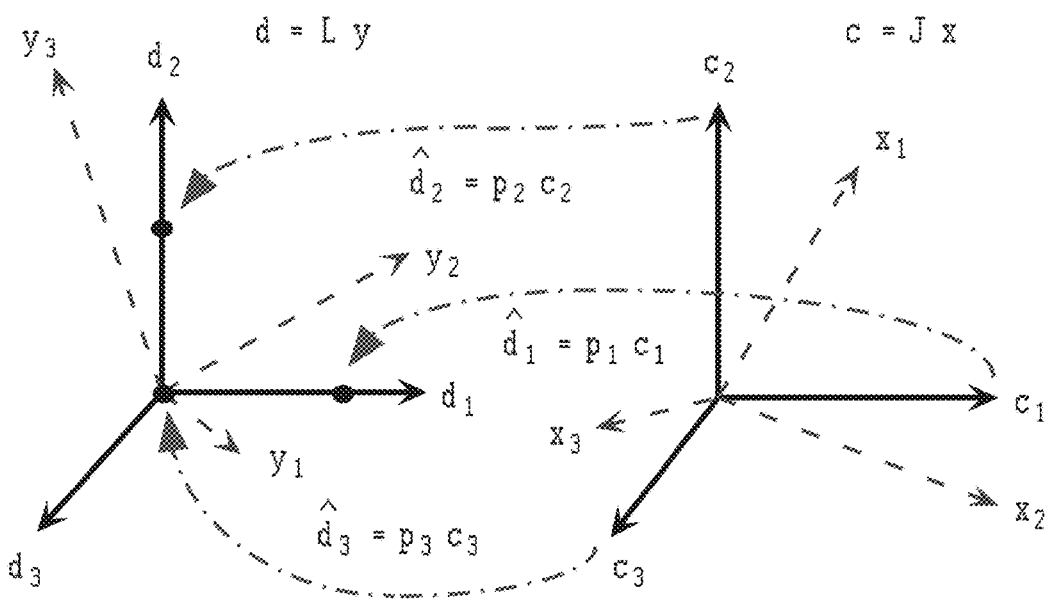
FIG. 5 is an exemplary diagram showing a Canonical Variate Analysis.

Referring now to exemplary FIGS. 1-3, the methods and systems described herein may be performed in a variety of steps. For example, in FIG. 1, a transformation from machine data to a machine dynamic model may be shown. In this embodiment, first, machine data related to any desired characteristic of a machine or operating machine may be collected and variables can be assigned in 100. The machine data may be collected in any of a variety of manners. For example, sensors may be employed which detect any desired condition, for example movement, vibration, speed, displacement, compression, and the like. Such sensors may be any available or known sensor and may be coupled to the machine or system, such as an engine, motor, suspension component, and the like, in any desired fashion. Data may be recorded by the sensors and transmitted to an appropriate memory or database and stored for later review, analysis, and exploitation. An input-output (N)ARX-LPV dynamic model to machine data may be fitted in 102, which is further reflected with respect to Equation 43 below. Then, in 104, a CVA-(N)LPV realization method may be utilized (as further described with respect to exemplary FIG. 2). Then, in 106, State Space-(N)LPV dynamic model construction may take place, using results, for example, related to Equations 37 and 38. Then, in step 108, a machine characteristic that is undesired may be isolated or eliminated. This may be accomplished by extrapolating the data generated from the dynamic model. In some exemplary embodiments, a machine can be further calibrated to isloate eliminate an undesired characteristic. In others, a machine may be modified or altered to isolate or eliminate an undesired characteristic. For example, in an automobile suspension, spring geometry or stiffness may be altered or different materials may be utilized on suspension components, as desired. On an engine, weight may be added or balanced in a desired fashion to reduce vibration or adjust for an undesired characteristic. On an aircraft, wings or components of wings may be reshaped, strengthened, formed of a different materials, or otherwise dynamically adjusted to remedy undesired flutter or remove any other undesired characteristics. In further exemplary embodiments, on any machine, a feedback control may be adjusted to remove undesired characteristics. For example, if an input is a control surface on a wing, and one or more accelerometers associated with the wing detects a cycle that is exciting the wing or causing vibration of the wing, a control system for the machine dynamic model may have feedback provided, for example in the negative, inverse or opposite of the vibration, to allow for the nulling out of the vibration. In such examples, feedback can be dynamically provided to remove a characteristic and provide results and data without physically altering the wing, or any other machine component described herein.

In exemplary FIG. 2, a CVA-(N)LPV realization method may be described. This can include computing a corrected future, performing a CVA, sorting state estimates and computing an AIC. These elements are described in more detail below. Then, in exemplary FIG. 3, some exemplary advantages of a machine dynamic model versus machine data may be shown. Some exemplary advantages include the machine dynamic model's near optimal (maximum likelihood lower bound) accuracy, having a number of estimated parameters near an optimal number corresponding to a true model order for large samples, and having a model accuracy RMS that is inversely proportional to the square root of the number of estimated parameters. Further, for the LTI problem with no inputs and Gaussian noise, the CVA approaches the lower bound for a large sample size and is among three subspace methods that have minimum variance in the presence of feedback for large samples. Also, a rank selection using CVA and AIC that approaches an optimal order, for example when measured by Kullback information. Additionally, the accuracy of subsequent monitoring, filtering, and control procedures can be related to or determined by the statistical properties of the CVA-(N)LPV realization method. Thus, the machine dynamic model can enable the direct implementation of high accuracy analysis of dynamics, filtering of noisy dynamic variables, accurate monitoring and fault detection, and high accuracy control or modification of the machine dynamic response characteristics.

Still referring to exemplary FIGS. 1-3, and with respect to the machine dynamic model that may be generated using the techniques described herein, the machine dynamic model may be utilized to monitor, modify, and control machine characteristics. Monitoring of machine behavior can be valuable for a variety of reasons with respect to different types of machines. For example, changes in machine behavior due to failure may be made, long term wear can be evaluated and modified to increase usefulness or better predict failure, damage may be evaluated and machine performance may be adjusted to avoid damage or wear, and the effects of faulty maintenance can be recorded and accounted for. As such, it is desirable to evaluate dynamic behavior in machines and detect any changes in the behavior as soon as possible.

The dynamic model, as described herein, can provide an accurate model as a baseline for comparison to observed input and output data at a future time interval. This can provide a tool for identifying how the dynamics of a machine have changed, which may further implicate a specific aspect of the machine or a component of the machine that can then be investigated to determine what remedies or modification may be possible. Without an accurate baseline dynamic model, as provided herein, there is typically no basis for comparison or monitoring for changes that may affect the machine dynamics.

In some further examples, the generation of a dynamic model may be important for various types of machines. For example, machines with rapid responses, such as aircraft or automobiles, can utilize dynamic modeling. An aircraft may be designed to be highly maneuverable at the expense of straight line flight stability, or changes in the dynamic behavior of the aircraft can occur from fatigue, damage, wear, and the like, such that the original behavior of the aircraft has changed, resulting in a need to augment, correct or adjust the dynamics in order to maintain or revert to the desired aircraft characteristics. With the dynamic model as described herein, physical changes in the machine dynamics of, for example, an aircraft, may be determined or predicted and this data can be used to compensate for physical changes by modifying control system behavior. In some examples this may only involve changing specific signals in a control system computer that can redesign, for example, the control feedback gain, in order to compensate for changes in the dynamic model. This can be referred to as "adaptive control". However the availability of a baseline machine dynamic model giving the desired machine behavior may be valuable both for detecting changes in dynamics as well as for compensating for some of these changes by modifying the feedback control signals.

CVA-LPV is, in general, a fundamental statistical approach using maximum likelihood methods for subspace identification of both LPV and nonlinear systems. For the LPV and nonlinear cases, this can lead to direct estimation of the parameters using singular value decomposition type methods that avoid iterative nonlinear parameter optimization and the computational requirements grow linearly with problem size as in the LTI case. The results are statistically optimal maximum likelihood parameter estimates and likelihood ratio hypotheses tests on model structure, model change, and process faults produce optimal decisions. As described herein, comparisons can be made between different system identification methods. These can include the CVA-LPV subspace method, prior subspace methods, and iterative parameter optimization methods such as prediction error and maximum likelihood. Also discussed is the Akaike information criterion (AIC) that is fundamental to hypothesis testing in comparing multiple model structures for a dynamic system.

According to one possible embodiment of the CVA-LPV approach, it may be used to analyze static input/output relationships, for example relationships with no system dynamics, that are deterministic, linear and without noise. In further embodiments, these ideas can be extended to the case of independent noise, and later to dynamics and autocorrelated noise. According to at least one exemplary embodiment wherein the CVA-LPV approach is used to analyze a data set where there is no noise corrupting the deterministic relationship between the input and the output, the relationship may be described by a matrix with a particular rank. This rank will be minimized via some manner of rank reduction, as in the case that there is noise in the observations there can be a large increase in the accuracy of the resulting model if the process is restricted to a lower dimensional subspace. Such a subspace has fewer parameters to estimate, and model accuracy can be inversely proportional to the number of estimated parameters.

For example, given N observations for $t=1, \ldots, N$ of the m×1 input vector $x_t$ and of the n×1 output vector $y_t$, these vectors may be placed in the matrices $X=(x_1, \ldots, x_N)$ and $Y=(y_1, \ldots, y_N)$. The subscript t may be used for indexing the observation number, and subscripts i or j may be used for the components of the observation vector; as such, $x_{i,t}$ would be an element of X.

The relationship between the input x and the output y may be described using such notation, whether this relationship is of full or reduced rank. A deterministic relationship may be assumed to exist between x and y given by y=Cx with C a m×n matrix. An intermediate set of variables z and matrices A and B may also be assumed, such that:

$$z=Ax \text{ and } y=Bz \qquad \text{Equation 1}$$

Numerous potential variable sets could fulfill this relationship. For example, the set of intermediate variables as the input variables x themselves (that is, A=I and B=C) could be used; alternatively, z could be chosen to be the output variables y (with A=C and B=I). However, reductions in processing complexity may be achieved by employing an intermediate set z such that the dimension of z, dim(z), is a minimum. The rank of C is defined as the minimum dimension that any set z of intermediate variables can have and still satisfy Equation 1. Rank (C)≤min(m, n) since Equation 1 is satisfied by choosing z as either x or y. Thus, the rank (z)≤min(m, n). Note that by direct substitution, the matrix C=BA, is the matrix product of B and A. It can be seen that the above definition of the rank of the matrix C is the same as the usual definition of rank of a matrix given in linear algebra. The above definition is intended to be very intuitive for dynamical processes where the set of intermediate variables are the states of a process and the input and output are the past and future of the process, respectively.

The singular value decomposition (SVD) can provide a key to constructing the set of intermediate variables z and the matrices A and B. This construction may employ the use of an orthogonal matrix. A square matrix $U=(u_1, \ldots, u_p)$ is orthogonal if the column vectors $u_i$ are a unit length and orthogonal ($u_i^T u_i = 1$ and $u_i^T u_j = 0$ for i≠j, which is equivalent to $U^T U = I$, where I is the identity matrix). Orthogonal matrices, in this context, define transformations that are rigid rotations of the coordinate axes with no distortion of the coordinates. Thus, they can be used to define a new coordinate system that leaves distances and angles between lines unchanged.

For any real (n×m) matrix C, the singular value decomposition determines orthogonal matrices U(n×n) and V(m×m) such that:

$$U^T C V = \text{diag}(s_1, \ldots, s_k) = S \quad \text{Equation 2}$$

wherein S is the n×m diagonal matrix with diagonal elements $s_1 \geq \ldots s_r \geq s_{r+1} = \ldots = s_k = 0$ and $k = \min(m,n)$. The rank r of C is the number of nonzero diagonal elements of S. This can be shown in exemplary FIG. 4, which has singular value decomposition showing singular variables coordinates and reduced rank function.

The interpretation of the SVD may be as follows. The vector $g = V^T x$ is just x in a new coordinate frame and similarly $h = U^T y$ is y in a new coordinate frame. The transformation C from g to h is the diagonal matrix S. This is shown by the substitutions:

$$h = U^T y = U^T C x = (U^T C V)(V^T x) = Sg \quad \text{Equation 3}$$

Figure 6:
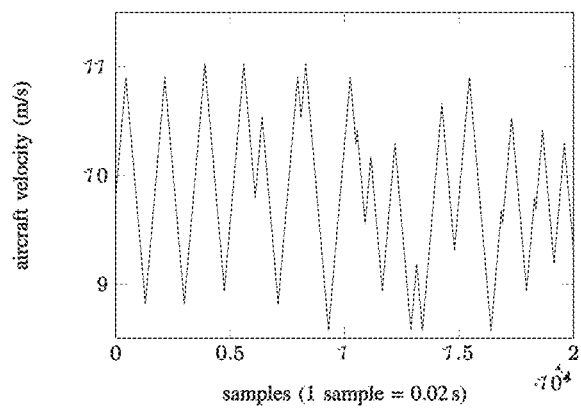
FIG. 6 is an exemplary diagram showing an aircraft velocity profile used as an input for identification.

Thus the transformation C decomposes into r=rank (C) univariate transformations $h_i = s_i g_i$ for $1 \leq i \leq r$ between the first r pairs of singular variables $(g_i, h_i)$ for $i=1, \ldots, r$. Note that the SVD yields two sets of intermediate or singular variables defined by g and h in terms of the matrices V and U of singular vectors. Further note that the singular variables g and h provide a special representation for the linear function given by the matrix C. They give y and x in a new set of coordinates such that on the first r pairs of variables $(g_i, h_i)$ for $i=1, \ldots, r)$ the function C is nonzero. Any other combinations of $(g_i, h_j)$ are zero. This will prove to be very important in the discussion of canonical variables. Exemplary FIG. 6 illustrates the case where $(s_1, s_2, s_3) = (0.8, 0.6, 0)$.

One potential embodiment of the set of intermediate variables z is that the first r singular variables are $(g_1, \ldots, g_r)$. Using these values, the A and B matrices are:

$$A = (I_r, 0) V^T, \quad B = U(I_r, 0)^T S \quad \text{Equation 4}$$

where $I_r$ is the r dimensional identity matrix. This may be confirmed via direct substitution, $BA = U(I_r \ 0)^T S(I_r \ 0) V^T = USV^T = C$ since S is diagonal with elements $s_{ii} = 0$ for $i \geq r$.

According to another embodiment, the matrix C will be initially unknown, and can be determined via the observations $X = (x_1, \ldots, x_N)$ and $Y = (y_1, \ldots, y_N)$ above. A rank representation via a SVD of C may also be determined. Since $y_t = Cx_t$ for every t, it follows that Y = CX, and multiplying by $X^T$ yields $YX^T = CXX^T$. If the matrix $XX^T$ is nonsingular (which may be assumed if it is assumed that the column vectors of X span the whole x space), then the matrix C may be solved for as:

$$C = YX^T(XX^T)^{-1} \quad \text{Equation 5}$$

The quantities $XX^T$ and $YX^T$ may be expressed in a normalized form as sample covariance matrices so:

$$S_{yx} = \frac{1}{N} \sum_{t=1}^{N} y_t x_t^T = \frac{1}{N} YX^T \quad \text{Equation 6}$$

And, similarly, matrices may be used for $S_{xx}$ and $S_{yy}$. In this notation, $\hat{C} = S_{yx} S_{xx}^{-1}$, the rank of $\hat{C}$ and an intermediate set of variables of reduced dimension that contain all of the information in the full set x of input variables may be determined by computing the SVD of this value.

While a deterministic function that is reduced rank may be readily described in terms of the observations of the inputs and outputs of the process, it is somewhat more complex to extend this approach to the case where there is noise in the observations. This is because, with the addition of noise, the sample covariance matrix $S_{xy}$ above usually becomes full rank, potentially reducing the utility of the above approach. It may be suggested that, in cases where noise is present, the singular values simply be truncated when they become "small," but this is often inadequate because scaling of the original variables can considerably affect the SVD in terms of how many "large" singular values there are.

An alternative exemplary embodiment may be considered that addresses the issue of noise without requiring that the singular values be truncated. Such an embodiment may employ two vectors of random variables, x and y, wherein the vector x is the set of predictor variables and the vector y is the set of variables to be predicted. It may be assumed that x and y are jointly distributed as normal random variables with mean zero and covariance matrices $\Sigma_{xx}$, $\Sigma_{yy}$, $\Sigma_{xy}$, and that the relationship giving the optimal prediction of y from x is linear. The extension to the case of a nonzero mean is trivial, and assuming a zero mean will simplify the derivation. As above, suppose that N observations $(x_t, y_t)$ for $1 \leq t \leq N$ are given and write $X = (x_1, \ldots, x_N)$ and $Y = (y_1, \ldots, y_N)$.

As previously described, it is useful to determine an intermediate set of variables z of dimension r that may be fewer in number than dim(x) such that z contains all of the information in x relevant to predicting y. This requires the determination of the dimension or rank r of z, as well as estimation of the parameters defining the linear relationships between x and z and between z and y.

A model may be described by the equations:

$$y_t = Bz_t + e_t \quad \text{Equation 7}$$

$$z_t = Ax_t \quad \text{Equation 8}$$

that holds for the t-th observations $(x_t, y_t)$ for $t = 1, \ldots, N$. The vector $e_t$ is the error in the linear prediction of $y_t$ from $x_t$ given matrices A(r×m) and B(n×r), and $\Sigma_{ee}$ is the covariance matrix of the prediction error $e_t$. It is assumed that for different observation indexes s and t, the errors $e_s$ and $e_t$ are uncorrelated. These equations are equivalent to predicting y from x as:

$$y_t = BAx_t + e_t = Cx_t + e_t \quad \text{Equation 9}$$

where the matrix C=BA has the rank constraint rank (C)≤r. Note that the embodiment described in this section is identical to that articulated previously, except that additional noise is added in Equation 7.

The method of maximum likelihood (ML) may be used for determining the matrices A and B. The optimality of maximum likelihood procedures will be discussed in detail in a later part of the specification; this includes the critically important issue of model order selection, i.e., determination of the rank r of z.

The joint likelihood of $X = (x_1, \ldots, x_N)$ and $Y = (y_1, \ldots, y_N)$ as a function of the parameters matrices A, B, $\Sigma_{ee}$ is expressed in terms of the conditional likelihood of Y given X as:

$$p(Y, X; A, B, \Sigma_{ee}) = p(Y|X; A, B, \Sigma_{ee}) p(X). \quad \text{Equation 10}$$

The density function p(X) of X is not a function of the unknown parameters A, B, and $\Sigma_{ee}$; as such, it may be maximized based on the known parameters. It should be noted that the solution is the same if X is conditioned on Y instead of Y on X.

The following canonical variate analysis (CVA) transforms the x and y to independent identically distributed (iid) random variables that are only pairwise correlated, i.e., with diagonal covariance. The notation $I_k$ is used to denote the k×k identity matrix.

CVA Theorem:

Let $\Sigma_{xx}$ (m×m) and $\Sigma_{yy}$ (n×n) be nonnegative definite (satisfied by covariance matrices). Then there exist matrices J($\bar{m}$×m) and L($\bar{n}$×n) such that:

$$J\Sigma_{xx}J^T = I_{\bar{m}}; L\Sigma_{yy}L^T = I_{\bar{n}} \quad \text{Equation 11}$$

$$J\Sigma_{xy}L^T = P = \text{diag}(p_1, \ldots, p_r, 0, \ldots, 0), \quad \text{Equation 12}$$

where $\bar{m}$=rank ($\Sigma_{xx}$) and $\bar{n}$=rank ($\Sigma_{yy}$). This provides a considerable simplification of the problem and is illustrated in exemplary FIG. 5. Exemplary FIG. 5 can demonstrate a canonical variate analysis that shows the canonical variables' coordinates and canonical correlations.

The transformations J and L define the vectors c=Jx and d=Ly of canonical variables. Each of the canonical variables c and d are independent and identically distributed with the identity covariance matrix since:

$$\Sigma_{cc} = J\Sigma_{xx}J^T = I, \Sigma_{dd} = L\Sigma_{yy}L^T = I. \quad \text{Equation 13}$$

The covariance of c and d is diagonal and may be described as:

$$\Sigma_{cd} = J\Sigma_{xy}L^T = P, \quad \text{Equation 14}$$

so that the i-th components of c and d are pairwise correlated with correlation $p_i$ in descending order. Thus, the CVA reduces the multivariate relationship between x and y to a set of pairwise univariate relationships between the independent and identically distributed canonical variables. Note that if $\Sigma_{xx}=I$ and $\Sigma_{yy}=I$, then the CVA reduces to the usual SVD with the correspondence $J=U^T$, $L=V^T$, $\Sigma_{xy}=C$, c=g, d=h, and $p_i=s_i$; such behavior may be observed in exemplary FIGS. 4 and 5.

Otherwise, the CVA may be described as a generalized singular value decomposition (GSVD) where the weightings $\Sigma_{xx}$ and $\Sigma_{yy}$ ensure that the canonical variables are uncorrelated; this is the random vector equivalent to orthogonality for the usual SVD. The components of the variables x may be very correlated or even colinear (though may not be); however, the components of the canonical variables c are uncorrelated, and similarly for y and d. This is the main difference with the SVD, where the components of x are considered orthogonal as in FIG. 6. As a result, the canonical variables c and d provide uncorrelated representatives for x and y respectively so that the problem can be solved in a numerically well conditioned and statistically optimal way.

An optimal choice, in this exemplary embodiment, for A, B, and $\Sigma_{ee}$ for a given choice of r may also be described. This solution is obtained by using the sample covariance matrices $S_{xx}$, $S_{yy}$, and $S_{xy}$, defined as in Equation 6 in place of $\Sigma_{xx}$, $\Sigma_{yy}$, and $\Sigma_{xy}$ in the GSVD equations 13 and 14. The GSVD computation gives J, L, and P. The optimal choice, in this embodiment, for A is:

$$\hat{A} = [I_r, 0]J; \text{ thus } z = [I_r, 0]Jx = [I_r, 0]c. \quad \text{Equation 15}$$

such that $\hat{A}$ is the first r rows of J. Equivalently z, the optimal rank r predictors of y, consists of the first r canonical variables $c_1, \ldots, c_r$. The predictable (with a reduction in error) linear combinations of y are given by the random variables $d=[I_r, 0]Ly$, the first r canonical variables $d_1, \ldots, d_r$. Denoting $P_r$ as P with $p_k$ set to zero for k≥r, the optimal prediction of d from c as per Equation 14 is simply $\hat{d}=P_r c$. The covariance matrix of the error in predicting d from c is $I-P_r^2$. The optimal estimates of B and $\Sigma_{ee}$ are obtained by applying the inverse (or, in the case that $S_{yy}$ is singular, the pseudoinverse denoted by †) of L to go from d back to y and are:

$$\hat{B} = L^\dagger P[I_r \ 0]^T; \hat{\Sigma}_{ee} = L^\dagger(I - P_r^2)L^{\dagger T}. \quad \text{Equation 16}$$

It should be noted that the relationship between X and Y is completely symmetric. As a result, if X and Y are interchanged at the beginning, the roles of A and J are interchanged with B and L in the solution.

The log likelihood maximized over A, B, and $\Sigma_{ee}$, or equivalently over C=BA with constrained rank r, is given by the first r canonical correlations $p_i$ between $c_i$ and $d_i$:

$$\max \log p(Y \mid X; C, \Sigma_{ee}) = \frac{N}{2} \sum_{i=1}^{r} \log |S_{yy}|^{-1}(1 - p_i^2). \quad \text{Equation 17}$$

Optimal statistical tests on rank may involve likelihood ratios. Thus, the optimal rank or order selection depends only on the canonical correlations $p_i$. A comparison of potential choices of rank can thus be determined from a single GSVD computation on the covariance structure. The above theory holds exactly for zero-mean Gaussian random vectors with $x_t$ and $x_j$ uncorrelated for i≠j. For time series, this assumption is violated, though analogous solutions are available.

A number of other statistical rank selection procedures are closely related to CVA and may be used where appropriate or desired. As an illustrative example, consider the generalized singular value decomposition (GSVD) example with equation 13 replaced by:

$$J\Delta J^T = I_{\bar{m}}; L\Lambda L^T = I_{\bar{n}}, \quad \text{Equation 18}$$

where the weightings $\Delta$ and $\Lambda$ can be any positive semi-definite symmetric matrices. CVA is given by the choice $\Delta=\Sigma_{xx}$, $\Lambda=\Sigma_{yy}$. Reduced rank regression is $\Delta=\Sigma_{xx}$, $\Lambda=I$. Principal component analysis (PCA) is x=y, $\Lambda=I$. Principal component instrumental variables is x=y, $\Lambda=\Sigma_{yy}$. Partial least squares (PLS) solves for the variables z sequentially. The first step is equivalent to choosing $\Delta=I$, $\Lambda=I$ and selecting $z_1$ as the first variable. The procedure is repeated using the residuals at the i-th step to obtain the next variable $z_i$.

A downside of using the other statistical rank selection procedures is that they are not maximum likelihood as developed earlier (and discussed below with respect to various dynamic system models) and are not scale invariant (as is the case with all ML procedures under discussion). As a result, all of the other methods will give a different solution if the inputs and/or outputs are scaled differently, e.g. a change in the units from feet to miles. Also, the arbitrary scaling precludes an objective model order and structure selection procedure; this will also depend on the arbitrary scaling.

The methods other than CVA also require the assumption that the measurement errors have a particular covariance structure. For example, if using the PLS method, the model is of the form:

$$x_t = P^T u_t + e_t, y_t = Q^T u_t + f_t, \quad \text{Equation 19}$$

where the covariance matrix of $\Sigma_{ee}$ and $\Sigma_{ff}$ are assumed to be known and not estimated. If these errors have a much different covariance matrix than assumed, then the parameter estimation error can be much larger. PCA and the other problems above also assume that the covariance is known. As is known in the art, these latent variable methods must assume the covariance structure; it cannot be estimated from the data. This is a major obstacle in the application of these methods. As CVA makes no assumption concerning the covariance structure, but estimates it from the observations, in at least one embodiment of the GSVD that employs CVA, weighting is dictated by the data rather than an arbitrary specification.

As is known in the art, CVA is one of the subspace methods that effectively computes a generalized projection that can be described by a generalized singular value decomposition. The differences between the various subspace methods are the weightings $\Delta$ and $\Lambda$, and the other subspace methods almost always use weightings different from CVA. As a result, the other subspace methods are suboptimal and potentially may have much larger errors.

In some exemplary embodiments, the CVA method is applied to the identification of linear time-invariant (LTI) dynamic systems. Although the theory described above may only apply to iid multivariate vectors, it has been extended to correlated vector time series.

A concept in the CVA approach is the past and future of a process. For example, suppose that data are given consisting of observed outputs $y_t$ and observed inputs $u_t$ at time points labeled $t=1, \ldots, N$ that are equal spaced in time. Associated with each time $t$ is a past vector $p_t$ which can be made of of the past outputs and inputs occurring prior to time $t$, a vector of future outputs $f_t$ which can be made of outputs at time $t$ or later, and future inputs $q_t$ which can be made of inputs at time $t$ or later, specifically:

$$p_t = [y_{t-1}; u_{t-1}; y_{t-2}; u_{t-2}; \ldots],$$ Equation 20

$$f_t = [y_t; y_{t+1}; \ldots], q_t = [u_t; u_{t+1}; \ldots].$$ Equation 21

Then the case of a purely stochastic process with no observed deterministic inputs $u_t$ to the system can be considered. A fundamental property of a linear, time invariant, gaussian Markov process of finite state order is the existence of a finite dimensional state $x_t$ which is a linear function of the past $p_t$:

$$x_t = C p_t.$$ Equation 22

The state $x_t$ has the property that the conditional probability density of the future $f_t$ conditioned on the past $p_t$ is identical to that of the future $f_t$ conditioned on the finite dimensional state $x_t$ so:

$$p(f_t|p_t) = p(f_t|x_t).$$ Equation 23

Thus the past and future play a fundamental role where only a finite number of linear combinations of the past are relevant to the future evolution of the process.

To extend the results regarding CVA of multivariate random vectors to the present example of correlated vector time series, possibly with inputs, a past/future form of the likelihood function may be developed. To compute, the dimension of the past and future are truncated to a sufficiently large finite number $l$. Following Akaike, this dimension is determined by autoregressive (ARX) modeling and determining the optimal ARX order using the Akaike information criteria (AIC). The notation $y_s^t = [y_s; \ldots; y_t]$ is used to denote the output observations and similarly for the input observations $u_s^t$.

For dynamic input-output systems with possible stochastic disturbances, one desire is characterizing the input to output properties of the system. A concern is statistical inference about the unknown parameters $\theta$ of the probability density $p(Y|U, P; p_1^l|\theta)$ of the outputs $Y = {}_1^N$ conditional on the inputs $U = u_1^N$ and some initial conditions $p_1^l = [y_1^l; u_1^l]$.

Therefore, in this example, suppose that the number of samples N is exactly $N = Ml + l$ for some integer M.

Then by successively conditioning, the log likelihood function of the outputs Y conditional on the initial state $p_{l+1}$ at time $l+1$ and the input Q is:

$$\log p(Y_{l+1}^{Ml+l} | p_{l+1}, Q, \theta) = \sum_{m=0}^{M-1} \log p(f_{ml+l+1} | p_{ml+l+1}, Q, \theta)$$ Equation 24 where $Q = Q_1^{Ml+l}$, so the likelihood function decomposes into the product of M multistep conditional probabilities. Next, by shifting the interval of the observations in the above by time s, the likelihood of the observations $Y_{l+1+s}^{Ml+l+s}$ is obtained. Consider the average of these shifted log likelihood functions which gives:

$$\frac{1}{l} \sum_{s=0}^{l-1} \log p(Y_{l+1+s}^{Ml+l+s} | p_{l+1+s}, Q, \theta)$$ Equation 25

$$= \frac{1}{l} \sum_{s=0}^{l-1} \sum_{m=0}^{M-1} \log p(f_{ml+l+1+s} | p_{ml+l+1+s}, Q, \theta)$$ Equation 26

$$= \frac{1}{l} \sum_{t=l+1}^{N} \log p((f_t | q_t) | p_t, \theta))$$ Equation 27

Now each likelihood function in this average is a likelihood of $N-l$ points that differs only on the particular end points included in the time interval. This effect will disappear for a large sample size, and even in small sample size will provide a suitable approximate likelihood function.

The vector variables $f_t|q_t$ and $p_t$ are typically highly autocorrelated whereas the analogous vector variables $y_t$ and $x_t$ are assumed stochastically to each be white noise with zero autocorrelation. The difference is that $p_t$, $f_t$, and $q_t$ are stacked vectors of the time shifted vectors $y_t$ and $u_t$ that themselves can be highly correlated.

Notice that the way the term $f_t|q_t$ arises in some exemplary embodiments is that $p_t$ contains $u_1^{t-1}$, so that those of $Q = u_1^N$ not contained in $p_t$, namely $q_t = u_t^N$ remain to be separately conditioned on $f_t$. In further exemplary embodiments discussed below, $f_t|q_t$ will be called the "future outputs with the effects of future inputs removed" or, for brevity, "the corrected future outputs". Note that this conditioning arises directly and fundamentally from the likelihood function that is of fundamental importance in statistical inference. In particular, the likelihood function is a sufficient statistic. That is, the likelihood function contains all of the information in the sample for inference about models in the class indexed by the parameters $\theta$. Since this relationship makes no assumption on the class of models, it holds generally in large samples for any model class with $l$ chosen sufficiently large relative to the sample size.

In a further exemplary embodiment, it may be desired to remove future inputs from future outputs. The likelihood theory above gives a strong statistical argument for computing the corrected future outputs $f_t|q_t$ prior to doing a CVA.

The question is how to do the correction. Since an ARX model is computed to determine the number of past lags l to use in the finite truncation of the past, a number of approaches have been used involving the estimated ARX model.

For another perspective on the issue of removing future inputs from future outputs, consider a state space description of a process. A k-order linear Markov process has been shown to have a representation in the following general state space form:

$$x_{t+1} = \Phi x_t + G u_t + w_t \qquad \text{Equation 28}$$

$$y_t = H x_t + A u_t + B w_t + v_t \qquad \text{Equation 29}$$

where $x_t$ is a k-order Markov state and $w_t$ and $v_t$ are white noise processes that are independent with covariance matrices Q and R respectively. These state equations are more general than typically used since the noise $Bw_t + v_t$ in the output equation is correlated with the noise $w_t$ in the state equation. This is a consequence of requiring that the state of the state space equations be a k-order Markov state. Requiring the noises in Equation 28 and 29 to be uncorrelated may result in a state space model where the state is higher dimensional than the Markov order k so that it is not a minimal order realization.

Further exemplary embodiments may focus on the restricted identification task of modeling the openloop dynamic behavior from the input $u_t$ to the output $y_t$. Assume that the input $u_t$ can have arbitrary autocorrelation and possibly involve feedback from the output $y_t$ to the input $u_t$ that is separate from the openloop characteristics of the system in Equation 28 and Equation 29. The discussion below summarizes a procedure for removing effects of such possible autocorrelation.

The future $f_t = (y_t^T, \ldots, y_{t+l}^T)^T$ of the process is related to the past $p_t$ through the state $x_t$ and the future inputs $q_t = (u_t^T, \ldots, u_{t+l}^T)^T$ in the form:

$$f_t = \psi^T x_t + \Omega^T q_t + e_t \qquad \text{Equation 30}$$

where $x_t$ lies in some fixed subspace of $p_t$, $\psi^T = (H; H\Phi; \ldots; H\Phi^{l-1})$ and the i, j-th block of $\Omega$ is $H\Phi^{j-i}G$. The presence of the future inputs $q_t$ creates a major problem in determining the state space subspace from the observed past and future. If the term $\Omega^T q_t$ could be removed from the above equation, then the state space subspace could be estimated accurately. The approach used in the CVA method is to fit an ARX model and compute an estimate $\hat{\psi}$ of $\psi$ based on the estimated ARX parameters. Note that an ARX process can be expressed in state space form with state $x_t = p_t$ so that the above expressions for $\Omega$ and $\psi$ in terms of the state space model can be used as well for the ARX model. Then the ARX state space parameters ($\Phi$, G, H, A) and $\psi$ and $\Omega$ are themselves functions of the ARX model parameters $\hat{\Theta}_A$.

Now since the effect of the future inputs $q_t$ on future outputs $f_t$ can be accurately predicted from the ARX model with moderate sample size, the term $\Omega^T q_t$ can thus be predicted and subtracted from both sides of Equation 30. Then a CVA can be done between the corrected future $f_t - \Omega^T q_t$ and the past to determine the state $x_t$. A variety of procedures to deal with autocorrelation and feedback in subspace system identification for LTI systems have been developed with comparisons between such methods.

For the development for LPV models in latter exemplary embodiments, note that the corrected future is simply the result of a hypothetical process where for each time t the hypothetical process has past $p_t$ and with the future inputs $q_t$ set to zero. The result is the corrected future outputs $f_t - \Omega^T q_t$, i.e. the unforced response of the past state implied by the past $p_t$. Now taking all such pairs $(p_t, f_t - \Omega^T q_t)$ for some range of time t, a CVA analysis will obtain the transformation matrices of the CVA from which the state estimates can be expressed for any choice of state order k as $\hat{x}_k = J_k p_t$ as discussed below.

The most direct approach is to use the ARX model recursively to predict the effect of the future inputs one step ahead and subtract this from the observed future outputs. The explicit computations for doing this are developed specifically for the more general LPV case.

The CVA on the past and future gives the transformation matrices J and L respectively specifying the canonical variables c and d associated with the past $p_t$ and the corrected future outputs $f_t | q_t$. For each choice k of state order (the rank r) the "memory" of the process (the intermediate variables $z_t$) is defined in terms of the past as $$m_t = J_k p_t = [I_k 0] J p_t, \qquad \text{Equation 31}$$

where the vector $m_t$ can be made of the first k canonical variables. The vector $m_t$ is intentionally called 'memory' rather than 'state'. A given selection of memory $m_t$ may not correspond to the state of any well defined k-order Markov process since truncating states of a Markov process will not generally result in a Markov process for the remaining state variables. In particular, the memory $m_t$ does not usually contain all of the information in the past for prediction of the future values of $m_t$, i.e. $m_{t+1}, m_{t+2} \ldots$ . For the system identification problem, this is not a problem since many orders k will be considered and the one giving the best prediction will be chosen as the optimal order. This optimal order memory will correspond to the state of a Markov process within the sampling variability of the problem.

In a further exemplary embodiment, the problem of determining a state space model of a Markov process and a state space model estimation may be made. The modeling problem is: given the past of the related random processes $u_t$ and $y_t$, develop a state space model of the form of Equations 28 and 29 to predict the future of $y_t$ by a k-order state $x_t$. Now consider the estimation of the state space model and then its use in model order selection. Note that if over an interval of time t the state $x_t$ in Equations 28 and 29 was given along with data consisting of inputs $u_t$ and outputs $y_t$, then the state space matrices $\Phi$, G, H, and A could be estimated easily by simple linear multiple regression methods. The solution to the optimal reduced rank modeling problem is given above in terms of the canonical variables. For a given choice k of rank, the first k canonical variables are then used as memory $m_t = J_k p_t$ as in equation 31 in the construction of a k-order state space model.

In particular, consider the state Equations 28 and 29 with the state $x_t$ replaced with the memory $m_t$ determined from CVA. The multivariate regression equations are expressed in terms of covariances, denoted by $\Sigma$, among various vectors as:

$$\begin{pmatrix} \Phi & G \\ H & A \end{pmatrix} = \Sigma \begin{pmatrix} m_{t+1} & m_t \\ y_t & u_t \end{pmatrix} \Sigma^{-1} \begin{pmatrix} m_t & m_t \\ u_t & u_t \end{pmatrix} \qquad \text{Equation 32}$$

where computation is obtained by the substitution of $m_t = J_k p_t$. The covariance matrix of the prediction error as well as matrices Q, R, and B have similar simple expressions.

In a further exemplary embodiment, an objective model structure selection may be determined, along with the state order. The CVA method permits the comparison of very general and diverse model structures such as the presence of an additive deterministic polynomial, the state order of the system dynamics, the presence of an instantaneous or delayed effect on the system output from the inputs, and the feedback and 'causality' or influence among a set of variables. The methods discussed below allow for the precise statistical comparison of such diverse hypotheses about the dynamical system.

To decide on the model state order or model structure, recent developments based upon an objective information measure may be used, for example, involving the use of the Akaike Information Criterion (AIC) for deciding the appropriate order of a statistical model. Considerations of the fundamental statistical principles of sufficiency and repeated sampling provide a sound justification for the use of an information criterion as an objective measure of model fit. In particular, suppose that the true probability density is $p_*$ and an approximating density is $p_1$, then the measure of approximation of the model $p_1$ to the truth $p_*$ is given by the Kullback discrimination information:

$$I_Y(p_*, p_1) = \int p_*(Y) \log \frac{p_*(Y)}{p_1(Y)} dY. \qquad \text{Equation 33}$$

It can be shown that for a large sample the AIC is an optimal estimator of the Kullback information and achieves optimal decisions on model order. The AIC for each order k is defined by:

$$AIC(k) = -2 \log p(Y^N, U^N; \hat{\theta}_k) + 2fM_k, \qquad \text{Equation 34}$$

where p is the likelihood function based on the observations ($Y^N$, $U^N$) at N time points, where $\hat{\theta}_k$ is the maximum likelihood parameter estimate using a k-order model with $M_k$ parameters. The small sample correction factor f is equal to 1 for Akaike's original AIC, and is discussed below for the small sample case. The model order k is chosen corresponding to the minimum value of AIC(k). For the model state order k taken greater than or equal to the true system order, the CVA procedure provides an approximate maximum likelihood solution. For k less than the true order, the CVA estimates of the system are suboptimal so the likelihood function may not be maximized. However this will only accentuate the difference between the calculated AIC of the lower order models and the model of true order so that reliable determination of the optimal state order for approximation is maintained.

The number of parameters in the state space model of Equations 28 and 29 is:

$$M_k = k(2n+m) + mn + n(n+1)/2, \qquad \text{Equation 35}$$

where k is the number of states, n is the number of outputs, and m is the number of inputs to the system. This result may be developed by considering the size of the equivalence class of state space models having the same input/output and noise characteristics. Thus the number of functionally independent parameters in a state space model is far less than the number of elements in the various state space matrices. The AIC provides an optimal procedure for model order selection in large sample sizes.

A small sample correction to the AIC has been further been developed for model order selection. The small sample correction factor f is:

$$f = \frac{N}{N - \left(\frac{M_k}{n} + \frac{n+1}{2}\right)} \qquad \text{Equation 36}$$

The effective sample size N is the number of time points at which one-step predictions are made using the identified model. For a large sample N, the small sample factor f approaches 1, the value of f originally used by Akaike in defining AIC. The small sample correction has been shown to produce model order selection that is close to the optimal as prescribed by the Kullback information measure of model approximation error.

The nonlinear system identification method implemented in the CVA-LPV method and presented in this further exemplary embodiment is based on linear parameter-varying (LPV) model descriptions. The affine state space LPV (SS-LPV) model form may be utilized because of its parametric parsimony and for its state space structure in control applications. The ARX-LPV (autoregressive input/output) model form used for initial model fitting also plays a vital role. The introduction of the model forms can be followed by the fitting and comparing of various hypotheses of model structure available in the CVA-LPV procedure, as well as discussion of computational requirements.

In further exemplary embodiments, affine state space LPV models may be considered. Consider a linear system where the system matrices are time varying functions of a vector of scheduling parameters $\rho_t = [\rho_t(1); \rho_t(2); \ldots; \rho_t(s)]$, also called parameter-varying (PV) functions, of the form:

$$x_{t+1} = A(\rho_t)x_t + B(\rho_t)u_t + w_t \qquad \text{Equation 37}$$

$$y_t = C(\rho_t)x_t + D(\rho_t)u_t + v_t. \qquad \text{Equation 38}$$

In this embodiment, only LPV systems are considered having affine dependence on the scheduling parameters of the form $A(\rho_t) = \rho_t(1)A_1 + \ldots + \rho_t(s)A_s$ and similarly for $B(\rho_t)$, $C(\rho_t)$, and $D(\rho_t)$. Here the parameter-varying matrix $A(\rho_t)$ is expressed as a linear combination specified by $\rho_t = [\rho_t(1); \rho_t(2); \ldots; \rho_t(s)]$ of constant matrices $A = [A_1 \ldots A_s]$, called an affine form and similarly for B, C, and D. Note that Equations 37 and 38 are a linear time-varying system with the time-variation parameterized by $\rho_t$.

LPV models are often restricted to the case where the scheduling functions $\rho_t$ are not functions of the system inputs $u_t$, outputs $y_t$, and/or states $x_t$. The more general case including these functions of $u_t$, $y_t$, and $x_t$ is often called Quasi-LPV models. In this embodiment, there is no need to distinguish between the two cases so the development will apply to both cases.

The LPV equations can be considerably simplified to a LTI system involving the Kronecker product variables $\rho_t \otimes x_t$ and $\rho_t \otimes u_t$ in the form:

$$\begin{pmatrix} x_{t+1} \\ y_t \end{pmatrix} = \begin{pmatrix} A & B \\ C & D \end{pmatrix} \begin{pmatrix} \rho_t \otimes x_t \\ \rho_t \otimes u_t \end{pmatrix} + \begin{pmatrix} w_t \\ v_t \end{pmatrix} \qquad \text{Equation 39}$$

where $\otimes$ denotes the Kronecker product $M \otimes N$ defined for any matrices M and N as the partitioned matrix composed of blocks i,j as $(M \otimes N)_{i,j} = m_{i,j}N$ with the i,j element of M denoted as $m_{i,j}$, and $[M; N] = (M^T N^T)^T$ denotes stacking the vectors or matrices M and N. In later embodiments, further exploitation of this LTI structure will result in LTI subspace like reductions in computations and increases in modeling accuracy.

Now consider the case where the state noise also has affine dependence on the scheduling parameters $\rho_t$ through the measurement noise $v_t$, specifically where $w_t$ in Equation 39 satisfies $w_t = K(\rho_t \otimes v_t)$ for some LTI matrix K. Then for the case of no parameter variation in the output Equation 38, it can be shown by simple rearrangement that the state equations are $$x_{t+1} = (\overline{A}\ \overline{B}\ K)\begin{pmatrix} \rho_t \otimes x_t \\ \rho_t \otimes u_t \\ \rho_t \otimes y_t \end{pmatrix} \quad \text{Equation 40}$$

$$y_t = (C\ D\ I)\begin{pmatrix} x_t \\ u_t \\ v_t \end{pmatrix}. \quad \text{Equation 41}$$

with $\overline{A}_i = A_i - K_i C, \overline{B}_i = B_i - K_i D$ and $$\begin{pmatrix} \overline{A} \\ \overline{B} \end{pmatrix} = \begin{pmatrix} \overline{A}_1 \ \ldots\ \overline{A}_s \\ \overline{B}_1 \ \ldots\ \overline{B}_s \end{pmatrix} \quad \text{Equation 42}$$

In the above form, the noise in the state equation is replaced by the difference between the measured output and the predicted output $v_t = y_e - (Cx_t + Du_t)$ that is simply a rearrangement of the measurement equation. As a result, only measured inputs, outputs and states appear in the state equations removing any need to approximate the effects of noise in the nonlinear state equations. A number of the exemplary embodiments below are of this form with D=0, where there is no direct feedthrough without delay in the measurement output equation.

In a further embodiment, the first step in the CVA-LPV procedure is to approximate the LPV process by a high order ARX-LPV model. For this embodiment, an LPV dynamic system may be approximated by a high order ARX-LPV system of the form:

$$y_t = \sum_{i=1}^{\ell} \alpha_i(\rho_{t-i} \otimes y_{t-i}) + \sum_{i=0}^{\ell} \beta_i(\rho_{t-i} \otimes u_{t-i}) + v_t \quad \text{Equation 43}$$

that gives a linear prediction $y_t$ of the present output $y_t$ at time t in terms of the past outputs $y_{t-i}$ and past and possibly present inputs $u_{t-i}$, where l is the order of the ARX-LPV process, and $v_t$ is a white noise process with covariance matrix $\Sigma_{vv}$. The lower limit of the second sum is equal to 1 if the system has no direct coupling between input and output, i.e. $\beta_0 = 0$.

The ARX-LPV Equation 43 is in the shifted form where the time shifts in the scheduling functions $\rho_{t+i}$ match those in the inputs $u_{t+i}$ and outputs $y_{t+i}$. This is one of only a few model forms that are available to avoid the introduction of dynamic dependence in the resulting state space LPV description to be derived from the ARX-LPV model. The presence of dynamic dependence can lead to considerable inaccuracy in LPV models.

Notice that in Equation 43, the parameter-varying schedule functions $\rho_{t-i}$ can be associated, or multiplied, either with the constant matrix coefficients $\alpha_i$ and $\beta_i$ or the data $y_t$ and $u_t$. In the first case, the result is the parameter-varying coefficients $\alpha_i(\rho_{t-i} \otimes I_y)$ and $\beta_i(\rho_{t-i} \otimes I_u)$ respectively to be multiplied by $y_{t-i}$ and $u_{t-i}$, where the dimensions of the identity matrix $I_y$ and $I_u$ are respectively the dimensions of y and u. In the second case, since the time shift t−i is the same in all the variables $y_{t-i}$, $u_{t-i}$ and $\rho_{t-i}$, the augmented data $\{\rho_t \otimes y_t, \rho_t \otimes u_t\}$ can be computed once for each time t and used in all subsequent computations.

The past of the ARX-LPV process is defined as $p_t = [\rho_{t-1} \otimes y_{t-1}; \rho_{t-1} \otimes u_{t-1}; \ldots; \rho_{t-l} \otimes y_{t-l}; \rho_{t-l} \otimes u_{t-l}]$ with the terms of the ARX-LPV model that are multiplied by the LTI coefficients $\alpha_i$ and $\beta_j$ for j>0. The past $p_t$ is a state for the ARX-LPV process since it contains all of the information in the past for linear prediction of the future evolution of the process. The past $p_t$ is in general not minimal order and often much higher than minimal order. Notice that the evolution is dependent on the schedule $\rho_t$, so if the schedules $\rho_t \neq \overline{\rho}_t$ differ then the corresponding states $p_t \neq \overline{p}_t$ differ. Note that the schedule $\rho_t$ can be chosen arbitrarily or various changes in the schedule can be considered with corresponding changes in the past.

As further described herein, the association of the scheduling functions $\rho_t$ with the data will allow the direct adaptation of the CVA subspace method for linear time invariant (LTI) systems to LPV systems including all of the computational and numerical advantages of the LTI method. In particular, the ARX-LPV equations become LTI in the augmented data, and calculation of the coefficient estimates for the ARX-LPV model is nearly the same as for an ARX-LTI model using the augmented data.

In this embodiment as well as those following, the CVA subspace identification method described previously that can be made applicable LTI systems is extended to LPV systems. This development has considerable significance since previous methods for the identification of LPV systems require nonlinear iterative optimization that can have accuracy and/or convergence problems, or require subspace computational methods that grow exponentially with the number of inputs, outputs, states, and ARX-LPV order l. It will be shown that the CVA subspace identification method for LPV systems grows only as the cube of the number of such variables rather than exponentially.

The adaptation of the method to LPV systems involves the following steps:
Fit ARX-LPV models of sufficiently high order and compute the AIC for each order to determine the optimal order.
Remove the effects of future inputs on future outputs using the optimal ARX-LPV model order to determine the corrected future.
Do a CVA between the past and corrected future to determine optimal candidate state estimates, and sort these estimates by their predictive ability, i.e. correlation with future.
Compute the AIC for each state order to select the optimal state order.
Compute SS-LPV models for the optimal state order and other state orders of possible interest.

In a further embodiment, future inputs may be removed from future outputs. Here, the following definitions will be useful for a given time t: the past augmented inputs and outputs $p_t = [\rho_{t-1} \otimes y_{t-1}; \rho_{t-1} \otimes u_{t-1}; \ldots; \rho_{t-l} \otimes y_{t-l}; \rho_{t-l} \otimes u_{t-l}]$, or just past for brevity, the future outputs $f_t(y) = [y_{t+l}; y_{t+l-1}; \ldots; y_t]$, and the future inputs $q_t = [u_{t+l}; u_{t+l-1}; \ldots; u_t]$. The terms future inputs or future outputs include the present time t, and the length l of the past is the order l of the ARX-LPV model in Equation 43 for which the AIC is nominally a minimum. By removing the effects of future inputs on future outputs, it will be shown below that the resulting future outputs, called the corrected future and denoted $f_t(y)|q_t$, are then the result of the free response of the present state that is strictly a function of the past $p_t$ at time t of the system with the future inputs $q_t$ effectively set to zero. The state of the system can then be computed by doing a CVA between the past and the corrected future as it is done below.

The corrected future is computed iteratively using the optimal ARX-LPV model developed in the previous section. Several simplifications will greatly simplify the calculation. In the discussion below, it will be useful to view the ARX-LPV system from Equation 43 with the ARX coefficients $\alpha$ and $\beta$ and parameter varying functions $\rho_t$ fixed and as producing output sequences $y|_1^N$ from input sequences $u|_1^N$, where the notation is a shorthand for the whole sequence $y|_1^N \equiv [y_1; y_2; \ldots ; y_N]$ from t=1 to t=N, or some other contiguous subset of positive integers. By convention, the values of the sequences for non-positive integers are assumed to be the zero scaler or appropriately dimensioned zero vector. The sum of two sequences may be defined to be the sum of the elements with corresponding time indices.

First it will be shown that for the ARX-LPV of Equation 43, if $\bar{u}_t$ and $\tilde{u}_t$ are two input sequences and the corresponding output sequences are $\bar{y}_t$ and $\tilde{y}_t$, then the output $y_t$ of the sum sequence $u_t=\bar{u}_t+\tilde{u}_t$ of two input sequences is the sum of the corresponding output sequences so $y_t=\bar{y}_t+\tilde{y}_t$. This is stated in the following theorem (Theorem 1 below) with the $y|_1^N=ARX_{\rho|_1^N}(u|_1^N)$ In denoting $y|_1^N$ as the outputs of (24) with inputs $u|_1^N$ and with fixed ARX coefficients $\alpha$ and $\beta$, and fixed parameter varying functions $\rho_t$. Note that what is effectively implemented is to determine the unforced response of the ARX process with the $\rho_t$ fixed to the past $p_t$. This is the device for calculating the corrected future much as for the LTI case previously. Neither the inputs $u_t$, the outputs $y_t$ nor the PV functions $\rho_t$ are actually changed.

Theorem 1 (Additivity of Sequences): Let the ARX-LPV input-output relationship of Equation 43 with the noise $v_t=0$ for all t have finitely valued coefficients $\alpha_i$ and $\beta_i$, and let the parameter-varying functions $\rho|_1^N$ be finitely valued and fixed. Let $\bar{u}|_1^N$ and $\tilde{u}|_1^N$ be any finitely valued input sequences and denote the sum as $u|_1^N=\bar{u}|_1^N+\tilde{u}|_1^N$. Then the effects of these input sequences on the outputs are additive in the sense that:

$$ARX_{\rho|_1^N}(\bar{u}|_1^N+\tilde{u}|_1^N) = ARX_{\rho|_1^N}(\bar{u}|_1^N) + ARX_{\rho|_1^N}(\tilde{u}|_1^N).\quad \text{Equation 44}$$

Continuing with this rationale, the input-output relationship in Equation 43 with the noise $v_t=0$ for all t can have finitely valued coefficients $\alpha_i$ and $\beta_i$ and the parameter varying functions $\rho_1^N$ be finitely valued. Then let $\bar{u}_1^N$ and $\tilde{u}_1^N$ be any finitely valued input sequences and denote the sum as $\hat{u}_1^N=\bar{u}_1^N+\tilde{u}_1^N$. Then the effects of these input sequences on the outputs are additive in the sense that:

$$ARX(\bar{u}_1^N+\tilde{u}_1^N)=ARX(\bar{u}_1^N)+ARX(\tilde{u}_1^N) \quad \text{Equation 45}$$

Thus, it is sufficient to show that using Equation 43 to predict the present output $y|_1^N$ from the past inputs and outputs is additive in the inputs as in Equation 45. Then this additivity can be used recursively to show the additivity for any future outputs.

This follows simply since the Kronecker product satisfies $\alpha(\rho \otimes (\bar{y}+\tilde{y}))=\alpha((\rho \otimes \bar{y})+(\rho \otimes \tilde{y}))$ so:

$$y_t = \sum_{i=1}^{k} \alpha_i \rho_{t-i} \otimes y_{t-i} + \sum_{i=0}^{k} \beta_i \rho_{t-i} \otimes u_{t-i} \quad \text{Equation 46}$$

-continued $$= \sum_{i=1}^{k} \alpha_i \rho_{t-i} \otimes (\bar{y}_{t-i}+\tilde{y}_{t-i}) + \sum_{i=0}^{k} \beta_i \rho_{t-i} \otimes (\bar{u}_{t-i}+\tilde{u}_{t-i}) \quad \text{Equation 47}$$

$$= \left( \sum_{i=1}^{k} \alpha_i \rho_{t-i} \otimes \bar{y}_{t-i} + \sum_{i=1}^{k} \alpha_i \rho_{t-i} \otimes \tilde{y}_{t-i} \right) + \quad \text{Equation 48}$$

$$\left( \sum_{i=1}^{k} \beta_i \rho_{t-i} \otimes \bar{u}_{t-i} + \sum_{i=0}^{k} \beta_i \rho_{t-i} \otimes \tilde{u}_{t-i} \right) \quad \text{Equation 49}$$

$$= \left( \sum_{i=1}^{k} \alpha_i \rho_{t-i} \otimes \bar{y}_{t-i} + \sum_{i=0}^{k} \beta_i \rho_{t-i} \otimes \bar{u}_{t-i} \right) + \quad \text{Equation 50}$$

$$\left( \sum_{i=1}^{k} \alpha_i \rho_{t-i} \otimes \tilde{y}_{t-i} + \sum_{i=0}^{k} \beta_i \rho_{t-i} \otimes \tilde{u}_{t-i} \right) = \bar{y}_t + \tilde{y}_t \quad \text{Equation 51}$$

The sequences for $y_t$ and $u_t$ are defined to be zero for non-positive integers so the additivity holds for t=1. To prove by induction, we only need to show that if it holds for a given t−1 then it also holds for t. In the above equation, all of the use of additivity in the y's occurs involving index t−1 and less which justifies the final equality of $y_t=\bar{y}_t+\tilde{y}_t$. QED The above additive effects of input sequences on output sequences results in a simple additive correction to obtain the corrected future outputs $f_t(y)|(q_t=0)$ from the future inputs $q_t=u|_t^{t+l}$ as stated below in Theorem 2.

Theorem 2 (Corrected Future): Let the ARX-LPV process of order 1 be given by Equation 43 with the noise $v_t=0$ for all t have finitely valued coefficients $\alpha_i$ and $\beta_i$, and let the parameter-varying functions $p|_1^N$ be finitely valued and fixed. Let $\tilde{y}|_t^{t+l}=ARX(u_t^{t+l})$ denote the future ARX outputs as a result of future inputs $q_t=u|_t^{t+l}$ with inputs prior to time t being zero. This correction is computed recursively for j=0, 1, . . . , 1 as:

$$\tilde{y}_{t+j} = \sum_{i=1}^{j} \alpha_i(\rho_{t+j-i} \otimes \tilde{y}_{t+j-i}) + \sum_{i=0}^{j} \beta_i(\rho_{t+j-i} \otimes u_{t+j-i}).$$

Then the corrected future outputs $\bar{y}|_t^{t+l}=f_t(y)|(q_t=0)$ are given by:

$$\bar{y}|_t^{t+l}=y|_t^{t+l}-\tilde{y}|_t^{t+l}. \quad \text{Equation 52}$$

As proof of this theorem, and for convenience, the zero vector sequence for time t from M to N is denoted as $0|_M^N$. Now for each time t, consider the input sequence $\tilde{u}|_1^{t+l}$ as the future inputs $q_t$ preceded by t−1 zeros with $\tilde{u}=\{u|_1^{t-1}, 0|_t^{t+l}\}$. Then by subtracting $\tilde{u}_t$ from the actual input sequence $u|_1^{t+l}$ the resulting input sequence is:

$$\bar{u}|_1^{t+l}=\{u|_1^{t-1}, 0|_t^{t+l}\} \quad \text{Equation 53}$$

where the future $f_t$ of this input sequence is exactly the zero sequence. Now by construction:

$$u|_1^{t+l}=\tilde{u}|_1^{t+l}+\bar{u}|_1^{t+l} \quad \text{Equation 54}$$

so the desired corrected future response is obtained from the output sequence $\bar{y}|_1^{t+l}$ resulting from the difference of the input sequences:

$$\bar{u}|_1^{t+l}=u|_1^{t+l}-\tilde{u}|_1^{t+l}. \quad \text{Equation 55}$$

The corrected future output sequence is thus:

$$\tilde{y}|_1^{t+l} = ARX(\tilde{u}|_1^{t+l}) = ARX(u|_1^{t+l}) - ARX(\tilde{u}|_1^{t+l}) \quad \text{Equation 56}$$

$$= y|_1^{t+l} - ARX(\tilde{u}|_1^{t+l}) = y|_1^{t+l} - ARX(\{0|_1^{t-1}, u|_t^{t+l}\}) \quad \text{Equation 57}$$

$$= y|_1^{t+l} - \{0|_1^{t-1}, \tilde{y}|_t^{t+l}\} \quad \text{Equation 58}$$

with the corrected future given as the future of the last expression:

$$\bar{y}|_t^{t+l} = y|_t^{t+l} - \tilde{y}|_t^{t+l}. \quad \text{Equation 59}$$

To compute the corrected future using Equation 59, only the output $\tilde{y} = ARX(\{0|_1^{t-1}, u|_t^{t+l}\})$ of the ARX system due to the future inputs needs to be computed. Since the input is zero before time t, that is easily computed recursively for $j=0, 1, \ldots, l$ as:

$$\tilde{y}_{t+j} = \sum_{i=1}^{j} \alpha_i (\rho_{t+j-i} \otimes \tilde{y}_{t+j-i}) + \sum_{i=0}^{j} \beta_i (\rho_{t+j-i} \otimes u_{t+j-i}).$$

QED

As in the discussion of the CVA of LTI systems, the corrected future outputs is precisely the unforced future response of the ARX model with fixed $\rho_t$ to the past $p_t$ with no future input $q_t$.

Having removed the effects of future inputs on future outputs to obtain the corrected future, the corrected future is then the free response of the augmented past. The following Theorem can be used to display the structure of the LPV case.

Theorem 3 (LTI Structure of Past and Corrected Future): Consider the ARX-LPV process Equation 43 of order lags with no noise ($v_t=0$). Then for all t such that $l+1 < t < N-l$, the corrected future outputs $f_t(\bar{y}) = [\bar{y}_{t+l}; \ldots; \bar{y}_t]$, as defined in theorem 2, are LTI functions of the corrected augmented future $f_t(\rho \otimes \bar{y}) = [\rho_{t+l} \otimes \bar{y}_{t+l}; \ldots; \rho_t \otimes \bar{y}_t]$ and the augmented past $p_t = [\rho_{t-1} \otimes y_{t-1}; \ldots; \rho_{t-l} \otimes y_{t-l}; \rho_{t-1} \otimes u_{t-1}; \ldots; \rho_{t-l} \otimes u_{t-l}]$, and are expressed recursively in matrix form as:

$$(\bar{y}_{t+l}; \bar{y}_{t+l-1}; \ldots; \bar{y}_{t+1}; \bar{y}_t)^T = \quad \text{Equation 60}$$

$$\underbrace{\begin{pmatrix} 0 & \alpha_1 & \cdots & \alpha_{l-1} & \alpha_l \\ & \ddots & \ddots & \vdots & \vdots \\ & & \ddots & \alpha_1 & \alpha_2 \\ & & & \ddots & \alpha_1 \\ 0 & & \cdots & & 0 \end{pmatrix}}_{=:\alpha_f} \begin{pmatrix} \rho_{t+l} \otimes \bar{y}_{t+l} \\ \rho_{t+l-1} \otimes \bar{y}_{t+l-1} \\ \vdots \\ \rho_{t+1} \otimes \bar{y}_{t+1} \\ \rho_t \otimes \bar{y}_t \end{pmatrix} +$$

$$\underbrace{\begin{pmatrix} 0 & \cdots & & & 0 \\ \alpha_l & \ddots & & & \\ \vdots & \ddots & \ddots & & \vdots \\ \alpha_2 & \cdots & \alpha_l & & 0 \\ \alpha_1 & \cdots & \alpha_{l-1} & \alpha_l \end{pmatrix}}_{=:\alpha_p} \begin{pmatrix} \rho_{t-1} \otimes y_{t-1} \\ \rho_{t-2} \otimes y_{t-2} \\ \vdots \\ \rho_{t-l+1} \otimes y_{t-l+1} \\ \rho_{t-l} \otimes y_{t-l} \end{pmatrix} +$$

$$\underbrace{\begin{pmatrix} 0 & \cdots & & & 0 \\ \beta_l & \ddots & & & \\ \vdots & \ddots & \ddots & & \vdots \\ \beta_2 & \cdots & \beta_l & & 0 \\ \beta_1 & \cdots & \beta_{l-1} & \beta_l \end{pmatrix}}_{=:\beta_p} \begin{pmatrix} \rho_{t-1} \otimes u_{t-1} \\ \rho_{t-2} \otimes u_{t-2} \\ \vdots \\ \rho_{t-l+1} \otimes u_{t-l+1} \\ \rho_{t-l} \otimes u_{t-l} \end{pmatrix}$$

The matrix equation describes, for each $t+j$ for $0 \leq j \leq l$, a recursion in computing the corrected future output $\bar{y}_{t+j}$. This result is then used along with the parameter-varying functions $\rho_{t+j}$ that are known in real time to compute the elements $\rho_{t+j+1} \otimes \bar{y}_{t+j+1}$ of the corrected augmented future $\bar{f}_t$. Then the next recursion for $t+j+1$ can be computed. A more compact form of the above equation is:

$$f_t(\bar{y}) = \alpha_f f_t(\rho \otimes \bar{y}) + [\alpha_p \beta_p] p_t. \quad \text{Equation 61}$$

As proof of this, the desired result is obtained in the following steps.

First, in Equation 43, replace t by $t+j$, and then consider t as fixed as the present dividing the past and future with j considered as a variable with $j=0, 1, \ldots, l$ for recursive computation of Equation 43.

Second, for each j, the computation of terms in Equation 43 are partitioned into present-future terms (with sums from $i=0$ or 1 to j) and into past terms (with sums from $i=j+1$ to l) as $$y_{t+j} = \sum_{i=1}^{j} \alpha_i (\rho_{t+j-i} \otimes y_{t+j-i}) + \sum_{i=0}^{j} \beta_i (\rho_{t+j-i} \otimes u_{t+j-i}) +$$

$$\sum_{i=j+1}^{\ell} \alpha_i (\rho_{t+j-i} \otimes y_{t+j-i}) + \sum_{i=j+1}^{\ell} \beta_i (\rho_{t+j-i} \otimes u_{t+j-i})$$

Third, by subtracting Equation 45 from both sides of the above equation and using Equation 44, the result obtains:

$$\bar{y}_{t+j} = \sum_{i=1}^{j} \alpha_i (\rho_{t+j-i} \otimes \bar{y}_{t+j-i}) + \quad \text{Equation 62}$$

$$\sum_{i=j+1}^{\ell} \alpha_i (\rho_{t+j-i} \otimes y_{t+j-i}) + \sum_{i=j+1}^{\ell} \beta_i (\rho_{t+j-i} \otimes u_{t+j-i}) \quad \text{Equation 63}$$

where the terms are partitioned into sums of terms involving time indices prior to t, ($i=1, \ldots, j$), and time indices later than or equal t; ($i=j+1, \ldots, l$). This may also be shown in matrix form.

As in the LTI case discussed above, the future inputs introduce errors into the system identification and need to be removed from both sides of the equation by subtraction. This leaves the unforced response of the state due to past inputs and outputs. The compact form of Equation 22 can be rewritten as:

$$(\bar{I} - \alpha_f) f_t(\rho \otimes \bar{y}) = [\alpha_p \beta_p] p_t. \quad \text{Equation 64}$$

This follows since the first component of the scheduling vector $\rho_t$ is the constant 1 so each of the future corrected terms $\bar{y}_{t+i}$ for $i=1, \ldots, l$ composing the vector $f_t(\bar{y})$ of future corrected outputs are included as a subvector in the corrected augmented future vector $f_t(\rho \otimes \bar{y})$. Let $\bar{I} = [I_{dimy, dimy} 0_{dimy, dimy \times (dim\rho - 1)}]$ so that $\bar{I}(\rho_{t+l-i} \otimes \bar{y}_{t+l-i}) = \bar{y}_{t+l-i}$. Let Diag($\bar{I}$, n) be the $n \times n$ block diagonal matrix with diagonal blocks composed of $\bar{I}$. Then $f_t(\bar{y}) = \text{Diag}(\bar{I}, n) f_t(\rho \otimes \bar{y})$ so Equation implies Equation 64.

From Equation 22, since the coefficient matrices ($\bar{I} - \alpha_f$) and $[\alpha_p \beta_p]$ are LTI, the relationship between the past $p_t$ and corrected augmented future $\bar{f}_t$ is time invariant for all t. Thus a CVA can be done between these vectors as if they are LTI processes to obtain the state of the process. Also note that from Equation 22 the information from the past is provided only through an LTI function of the past plus an LTI function of the agumented corrected future. And this information is explicitly dependent on the schedule $\rho_t$. This structure justifies the use of a LTI CVA to obtain the state of the ARX-LPV process for use in state order selection and estimation of constant matrix [A B; C D] in the LPV state Equation 39 discussed below.

In a further exemplary embodiment, a maximum likelihood reduced rank state estimate may be utilized. The use of the multistep log likelihood function for various cases including that of inputs and feedback for LTI systems may be utilized. For example, it can be used to prove the asymptotic convergence of the CVA algorithm to obtain asymptotically maximum likelihood estimates for the case of LTI systems with no inputs or white noise inputs. The theorem below extends it to the case of LPV systems.

Theorem 4 (ML State Estimation of Reduced Rank): For a LPV-ARX process of order l lags, the asymptotic gaussian log likelihood function of the observed outputs $y|_1^N$ conditional on the initial past $p_l$ and the observed inputs $u|_1^N$ and as a function of the reduced rank regression parameters, can be expressed in the multistep ahead form:

$$\log p((y|_1^N) | p_\ell, (u|_1^N), (\rho|_1^N), \theta) = \frac{1}{\zeta} \sum_{t=\ell+1}^{N-\ell} \log p((f_t(\overline{y}) | p_t, \theta) \quad \text{Equaiton 65}$$

where $f_t(\overline{y})$ is the vector of corrected future outputs of dimension $\zeta$, and $p_t$ is the vector of augmented past outputs and possibly inputs as in theorem 3. The maximum likelihood solution for a state of rank r is obtained by a canonical variate analysis between the augmented past $p_t$ and the corrected future outputs $f_t(\overline{y})$, and by choosing the state specified by the first r canonical variables $x_t^{(r)}=J_r p_t$ given by the first r rows of J.

The parameterization in the likelihood is the CVA regression parameterization between past and future that does not incorporate the time shift invariance properties of a LPV state space model. This is refined further in the exemplary embodiment below and used to evaluate the model fit accuracy and select the optimal state order. The nested ML model projection for the LTI case from ARX into CVA, and finally into SS form may be realized, and the LTI case easily generalizes to the present LPV case.

In a further embodiment, a state space order selection and model estimation may be made. The canonical variables determined by the CVA of past and corrected future provide the candidate state variables. For a rank r candidate state vector $x_t^{(r)}=J_r p_t$, the LPV state equations can be written in an order recursive computation in the state since the Kronecker product elements $\rho_t \otimes x_t$ involving the state variables can be reordered as $x_t \otimes \rho_t = [x_{1,t}\rho_t; x_{2,t}\rho_t, \ldots, x_{k,t}\rho_t]$ with corresponding reorder of the columns of A and C to $\tilde{A}$ and $\tilde{C}$, respectively in Equation 39. Similarly, the covariance matrix of the residual prediction error in Equation 39 can be easily computed.

The better choices for states are determined by computation of the AIC for each choice of state order. In the case of noise in the process, the various matrices are of full rank so the appropriate state order is not obvious. For the case of gaussian noise in an LPV process, the AIC provides an optimal selection of state order.

In the next embodiment, an LPV extension to affine nonlinear systems can be performed. The class of affine nonlinear system are systems expressed as linear combinations of basis functions, usually meaning monomials. In this section, the approximation of a general nonlinear system with continuous input-output map or state equations involving continuous functions is discussed. First a nonlinear set of state equations involving analytic functions are approximated by polynomial functions and expressed in bilinear equations of LPV form. This permits use of the LPV system identification methods. Then the universal properties of such affine nonlinear approximation methods are discussed.

However, the scheduling functions of the bilinear LPV form are functions of the states, so the previous CVA LPV identification methods do not apply. The theory is extended to include nonlinear state affine systems that are Quasi-LPV where the scheduling functions $\rho_t$ may be functions of $u_t$, $y_t$, and/or $x_t$, i.e. the $\rho_t$ may not be exogenous. This leads to a hierarchical structure involving polynomial degree, and within a given degree to a set of models ordered by the state order.

There is a considerable literature on affine polynomial systems (see A. Schrempf, *Identification of Extended State Affine Systems*. Ph.D Dissertation, Johannes Kepler University, Linz, Austria, 2004, the contents of which are herein incorporated by reference in its entirety). Here some of the major issues and results relevant to model approximation and system identification are discussed.

Affine nonlinear systems have the property of a universal approximator that is of considerable importance. Given any LTI system, it is possible to approximate any such system by choosing a sufficiently high state order system as an approximator. A similar property is available for approximating nonlinear discrete-time systems having continuous input-output maps by discrete-time state affine (polynomial) systems. In particular, the following Corollary is stated by A. Schrempf.

Corollary 2.1: Every nonlinear system $\Sigma_a$ represented by a continuous input-output map $\phi: U \mapsto Y$ with fading memory on U where U is a ball in $l^\infty(Z)$, can be arbitrarily well approximated by an output-affine difference equation $S_a$.

By restricting such systems to a finite period of time, they can be realized using strictly recursive difference equations that can be determined using ordinary least squares computations to determine the polynomial difference equation coefficients. (A. Schrempf, Theorem 2.4)

The final step in his strategy is to obtain an Affine State Space realization of the polynomial system for which the CVA method will be utilized in this paper. The CVA procedure starts with obtaining an NARX-LPV input-output description by solving a simple linear regression computation, and then using the CVA-LPV method to obtain an Affine NLPV-state space model description. In particular, as developed in the following section involving Quasi-LPV systems, the state affine form is exactly a bilinear form with higher order polynomials in the inputs and/or possibly outputs as parameter-varying scheduling functions along with any exogenous scheduling functions.

An affine state space model with continuous input-output map that is generally a nonlinear, time-varying, and parameter-varying dynamic system can be described by a system of nonlinear state equations of the form:

$$x_{t+1}=f(x_t,u_t,\rho_t,v_t) \quad \text{Equation 66}$$

$$y_t=h(x_t,u_t,\rho_t,v_t) \quad \text{Equation 67}$$

where $x_t$ is the state vector, $u_t$ is the input vector, $y_t$ is the output vector, and $v_t$ is a white noise measurement vector. To deal with 'parameter-varying' systems, the 'scheduling' variables $\rho_t$ are time-varying parameters describing the present operating point of the system.

For simplicity and intuitive appeal, the case of functions admitting Taylor expansions where $\rho_t$ and $v_t$ are absent leads to (extending the case of $u_t$ being a scalar to the case of $u_t$ being a vector (W. Rugh, Nonlinear Systems Theory: The Volterra/Wiener Approach. Baltimore: The Johns Hopkins University Press, 1981, the contents of which are herein incorporated by reference in its entirety):

$$x_{t+1} = \sum_{i=0}^{J} \sum_{j=0}^{J} F_{ij}(x_t^{(i)} \otimes u_t^{(j)}) \qquad \text{Equation 68}$$

$$y_t = \sum_{i=0}^{J} \sum_{j=0}^{J} H_{ij}(x_t^{(i)} \otimes u_t^{(j)}) \qquad \text{Equation 69}$$

where the notation $x_t^{(i)}$ is defined recursively as $x_t^{(i)} = x_t x_t^{(i-1)}$ and similarly for $u_t^{(j)}$ where $x_t^{(1)} = x_t$ and $u_t^{(0)}$ is defined as the vector of 1's of dimension that of $u_t$.

The equations can be simply converted via Carleman bilinearization to bilinear vector discrete-time equations in the state variable $x_t^{\otimes} = [x_t^{(1)}; x_t^{(2)}; \ldots x_t^{(J)}]$, and the input power and products variables $u_t^{\otimes} = [u_t^{(0)}; u_t^{(1)}; \ldots u_t^{(J-1)}] = u_t^{\otimes(J-1)}$ where the last equality is used to emphasize the degree J−1, giving the state-affine form:

$$x_{t+1}^{\otimes} = \sum_{i=0}^{J-1} A_i(u_t^{(i)} \otimes x_t^{\otimes}) + \sum_{i=0}^{J-1} B_i(u_t^{(i)} \otimes u_t) \qquad \text{Equation 70}$$

$$y_t = \sum_{i=0}^{J-1} C_i(u_t^{(i)} \otimes x_t^{\otimes}) + \sum_{i=0}^{J-1} D_i(u_t^{(i)} \otimes u_t) \qquad \text{Equation 71}$$

These bilinear equations can be expressed in the state-affine LPV form with $\rho_t = u_t^{\otimes}$, that gives an exact solution for the Quasi-LPV case of no noise that is identical to the Strict-LPV form of Eq. 39 with D=0 but with $x_t^{\otimes}$ much higher dimension in general, as:

$$x_t^{\otimes} = A(\rho_t \otimes x_t^{\otimes}) + B(\rho_t \otimes u_t) \qquad \text{Equation 72}$$

$$y_t = C(\rho_t \otimes x_t^{\otimes}) + D(\rho_t \otimes u_t) \qquad \text{Equation 73}$$

An extended state-affine system described in A. Schrempf may be expressed in the form $$x_t = Ax_t + N(f(u_t, y_t) \otimes x_t) + Bu_t + Mg(u_t) \qquad \text{Equation 74}$$

$$y_t = Cx_t \qquad \text{Equation 75}$$

where $f(u_t, y_t)$ and $g(u_t)$ are polynomial functions, and setting the scheduling functions to the monomial terms of these polynomials denoted as $\rho_t = [1; \text{mon}\{f(u_t, y_t)\}; \text{mon}\{g(u_t)\}]$, this system reduces to the form of Equations 74 and 75

It can be noted that the bilinear state affine form is exactly in the form of that of the SS-LPV form of Equation 39. As is known in the art, for every SS-LPV model of the form Equation 39, there exists a ARX-LPV model in the shifted form Equation 43 with the same input-output characteristics and visa versa. Thus, for the purpose of constructing a state affine LPV model in the form of Equations 74-75, the ARX-LPV form Equation 39 can first be fitted using least squares, with scheduling functions $\rho_t$ including monomial terms involving powers and products of $u_t$ and $y_t$ up to some chosen degree. The bilinear Equations 74-75 can include these terms and may be described as a nonlinear ARX-LPV, i.e. a NARX-LPV.

Thus, in the Quasi-LPV case, the fitting of Equation 39 possibly including various monomial terms in the dynamic variables can be considered and the model fits compared using the Akaike Information Criterion. This can determine the better-fitting model structures and corresponding monomials in $u_t$ and $y_t$ to include in the scheduling functions to determine the structure and order of the NARX-LPV model Equation 39. Then the CVA-NLPV method can be applied using the identified NARX-LPV model to determine the state affine model Equations 68-69.

Then, in a further embodiment, the more general form of the nonlinear state equations may be considered. In this case the scheduling parameters may be denoted by $\bar{\rho}_t$ as distinct from the input product terms $u_t^{\otimes}$. These scheduling parameters $\bar{\rho}_t$ may be nonlinear functions of the operating point or other known or accurately measured variables qualifying as scheduling functions. Then the composite scheduling functions $\rho_t = \bar{\rho}_t \otimes u_t^{\otimes}$ can be defined that include both the polynomials $u_t^{\otimes}$ in the inputs and the scheduling functions $\bar{\rho}_t$. Then the bilinear equations again include this case.

The simplicity of the affine bilinear equations belies the considerable number of terms and complexity because much of the nonlinearity is adsorbed into the PVs. But this is far simpler than an expansion in an exponentially growing number of impulse response terms in Volterra series or the exponentially growing number of rows in the QR decomposition of other LPV subspace methods. The dimension of the state $x_t^{\otimes}$ of the LPV equation is $r+r^2+\ldots+r^J=-1+(r^{J+1}-1)/(r-1)$ where r is the dimension of the nonlinear state $x_t$ of Equation 66 and similarly the dimension of $u_t^{\otimes}$ is $1+r+r^2+\ldots+r^{J-1}=(r^J-1)/(r-1)$ where r the dimension of $u_t$. So the dimensions of $x_t^{\otimes}$ and $u_t^{\otimes}$ grow exponentially in the degree J of the expansion.

Thus it is desirable to choose the degree only high enough to achieve the desired accuracy. If there is noise or disturbances in the process or data, then it may be possible to determine the point at which increasing the degree of the approximation does not increase the accuracy. This situation may be detected by computing the ARX-LPV model fitting order recursive in J, where any lack of statistical significance with increasing degree can be determined with low order linear computations. Similarly, the significance of the PV functions can be determined with addition/deletion of various of the PV functions. After exhausting the structure selection of these 'composite scheduling functions' in the ARX-LPV fitting, the CVA subspace model identification does automatic order reduction. The need for the various states in LPV state vector $x_t^{\otimes}$ is evaluated in the canonical variate analysis, and those of no statistical significance are discarded to obtain a minimal state order realization.

The results are first stated for the Quasi-LPV case and then proven using methods other than those used for the Strict-LPV case.

For the purposes of this and following sections, terms "past operators" and "future operators" may be defined. Given a variable indexed by time t, (for example, $v_t$), for any fixed time t*, the future operator of length l is defined as $f_{t*}(v) = [v_{t*+l}; v_{t*+l-1}; \ldots; v_{t*}]$. Similarly, the past operator of length l may be defined as $p_{t*}(v) = [v_{t*-1}; v_{t*-2}; \ldots; v_{t*-l}]$. It should be noted that the future operator actually includes the present $v_{t*}$; the term future is used for brevity instead of present-future. The length of the past and future operators may be understood to be that of the ARX-LPV model unless otherwise noted, and t* will normally be denoted as t.

Definition 1 (Corrected Future)

Let the ARX-LPV process of order l be given by Equation 43 with no noise ($v_t$=0), and let the coefficients $\alpha_i$ and $\beta_j$ be finitely valued, and let the scheduling functions $\rho|_1^N$ be finitely valued and possibly functions of inputs $u_t$, outputs $y_t$, and states $x_t$ (the Quasi-LPV case). For every t, let $\tilde{y}|_t^{t+l} = f_t(\tilde{y})$ denote the future outputs due to future inputs with the effects of inputs prior to time t being zero and computed recursively for j=0, 1, ..., l as $$\tilde{y}_{t+j} = \sum_{i=1}^{j} \alpha_i(\rho_{t+j-i} \otimes \tilde{y}_{t+j-i}) + \sum_{i=0}^{j} \beta_i(\rho_{t+j-i} \otimes u_{t+j-i}). \qquad \text{Equation 76}$$

Denote the corrected future outputs as $\bar{y}|_t^{t+l} = \bar{f}_t(\tilde{y})$ and computed as $$\bar{y}|_t^{t+l} = y|_t^{t+l} - \tilde{y}|_t^{t+l}. \qquad \text{Equation 77}$$

The terms in the above definition are justified in the following Theorem.

Theorem 5 (LTI Structure of Past & Corrected Future, Quasi-LPV Case):

Consider the ARX-LPV process described in Equation 43 of order l lags with no noise ($v_t$=0) for the case of a Quasi-LPV process. Then for every t such that $l+1 < t < N-l$, the corrected future outputs $\bar{f}_t(\bar{y}) = [\bar{y}_{t+l}; \ldots; \bar{y}_t]$, as in Def 1, are LTI functions of the corrected augmented future $$\bar{f}_t(\rho \otimes \bar{y}) = [\rho_{t+l} \otimes \bar{y}_{t+l}; \ldots; \rho_t \otimes \bar{y}_t]$$

and the augmented past $$p_t = [\rho_{t-1} \otimes y_{t-1}; \ldots; \rho_{t-l} \otimes y_{t-l}; \rho_{t-1} \otimes u_{t-1}; \ldots; \rho_{t-l} \otimes u_{t-l}],$$

and are expressed recursively in matrix form as $$(\bar{y}_{t+l}; \bar{y}_{t+l-1}; \ldots; \bar{y}_{t+1}; \bar{y}_t)^T =$$

$$\underbrace{\begin{pmatrix} 0 & \alpha_1 & \cdots & \alpha_{l-1} & \alpha_l \\ & \ddots & \ddots & \vdots & \vdots \\ \vdots & & \ddots & \alpha_1 & \alpha_2 \\ & & & \ddots & \alpha_1 \\ 0 & \cdots & & & 0 \end{pmatrix}}_{=:\alpha_f} \begin{pmatrix} \rho_{t+l} \otimes \bar{y}_{t+l} \\ \rho_{t+l-1} \otimes \bar{y}_{t+l-1} \\ \vdots \\ \rho_{t+1} \otimes \bar{y}_{t+1} \\ \rho_t \otimes \bar{y}_t \end{pmatrix} \qquad \text{Equation 78}$$

$$+ \underbrace{\begin{pmatrix} 0 & \cdots & & & 0 \\ \alpha_l & \ddots & & & \\ \vdots & \ddots & \ddots & & \vdots \\ \alpha_2 & \cdots & \alpha_l & & 0 \\ \alpha_1 & \cdots & \alpha_{l-1} & \alpha_l \end{pmatrix}}_{=:\alpha_p} \begin{pmatrix} \rho_{t-1} \otimes y_{t-1} \\ \rho_{t-2} \otimes y_{t-2} \\ \vdots \\ \rho_{t-l+1} \otimes y_{t-l+1} \\ \rho_{t-l} \otimes y_{t-l} \end{pmatrix} +$$

$$+ \underbrace{\begin{pmatrix} 0 & \cdots & & & 0 \\ \beta_l & \ddots & & & \\ \vdots & \ddots & \ddots & & \vdots \\ \beta_2 & \cdots & \beta_l & & 0 \\ \beta_1 & \cdots & \beta_{l-1} & \beta_l \end{pmatrix}}_{=:\beta_p} \begin{pmatrix} \rho_{t-1} \otimes u_{t-1} \\ \rho_{t-2} \otimes u_{t-2} \\ \vdots \\ \rho_{t-l+1} \otimes u_{t-l+1} \\ \rho_{t-l} \otimes u_{t-l} \end{pmatrix}$$

The matrix equation describes, for each t+j for $0 \leq j \leq l$, a recursion in computing the corrected future output $\bar{y}_{t+j}$. This result is then used along with the parameter-varying functions $\rho_{t+j}$ that are known in real time to compute the elements $\rho_{t+j+1} \otimes \bar{y}_{t+j+1}$ of the corrected augmented future $\bar{f}_t(\rho \otimes \bar{y})$. Then the next recursion for t+j+1 can be computed. A more compact form of the above equation is $$\bar{f}_t(\bar{y}) = \alpha_f \bar{f}_t(\rho \otimes \bar{y}) + [\alpha_p \beta_p] p_t$$

As proof of this theorem, first, in Equation 43, replace t by t+j, and then consider t as the present time t dividing the past and the present-future for recursive computation of future outputs $y_{t+j}$ with j considered as the number of steps ahead of the present time t with j=0, 1, ..., l.

Second, for each j, the computation of terms in Equation 43 are partitioned into present-future terms (with sums from i=0 or 1 to j) and into past terms (with sums from i=j+1 to l) in lines Equation 79 and Equation 80 respectively, as per the following equations:

$$y_{t+j} = \sum_{i=1}^{j} \alpha_i(\rho_{t+j-i} \otimes y_{t+j-i}) + \sum_{i=0}^{j} \beta_i(\rho_{t+j-i} \otimes u_{t+j-i}) + \qquad \text{Equation 79}$$

$$\sum_{i=j+1}^{e} \alpha_i(\rho_{t+j-i} \otimes y_{t+j-i}) + \sum_{i=j+1}^{e} \beta_i(\rho_{t+j-i} \otimes u_{t+j-i}) \qquad \text{Equation 80}$$

Now consider a fixed j steps ahead in predicting $y_{t+j}$. It is apparent from these equations that the second term of Equation 79 has contributions only from present-future inputs, and all of Equation 80 has contributions only from past inputs and outputs. The first term of Equation 79 has contributions from both the past and present-future since the future outputs $y_{t+j-i}$ defined for i=1 to j are previously and recursively defined by Equation 79 and Equation 80. As such, the past and present-future contributions for each recursion in the computation of $y_{t+j-i}$ may be separately split out in the first term of Equation 79. It would thus be useful to prove the following Lemma.

Lemma 1 (Past and Present-Future Effects on Outputs)

Let time t split the past and present-future, and let $y_{t+j}$ be a present-future output with $0 \leq j \leq l$. Then the contribution of present-future inputs to $y_{t+j}$ is given by $\tilde{y}_{t+j}$ as in Equation 76, and the contribution of past inputs and outputs to $y_{t+j}$ is given by $\bar{y}_{t+j}$ as in Equation 77.

As proof of Lemma 1, (i) first Lemma 1 is demonstrated to be true for j=0, and then (ii) second it is shown for any choice of j* satisfying $0 < j^* \leq l$ that if Lemma 1 is true for all j satisfying $0 \leq j < j^*$, then Lemma 1 is also true for j=j*. So if (i) and (ii) are both true, then, by induction, Lemma 1 must also be true.

It is only necessary to keep track of the contribution from the present/future since doing this necessarily determines the correct contribution from the past since $y_{t+j-i} = \bar{y}_{t+j-i} + \tilde{y}_{t+j-i}$ with $y_{t+j-i}$ a particular observed output. To show (i) the contribution from the present/future given by both Equation 76 and Equation 79 agree since the first term of each are zero and the second terms are identical. To show (ii), assume that the splits $\tilde{y}_{t+j}$ and $\bar{y}_{t+j}$ are correct for $0 \leq j < j^*$, then it is required to show that this is also true for j=j*. If the substitution $y_{t+j-i} = \tilde{y}y_{t+j-i} + \bar{y}y_{t+j-i}$ is made in the first term in Equation 79, then this produces a sum of two terms, respectively associated with present/future and the past. Then associating $\tilde{y}y_{t+j-i}$ with the present/future and term 2 of line 1 gives $$\tilde{y}_{t+j} = \sum_{i=1}^{j} \alpha_i(\rho_{t+j-i} \otimes \tilde{y}_{t+j-i}) + \sum_{i=0}^{j} \beta_i(\rho_{t+j-i} \otimes u_{t+j-i}) \qquad \text{Equation 81}$$

while associating the $\bar{y}y_{t+j-i}$ term with past and line 2 of Equation 80 gives the expression below for computing $\bar{y}y_{t+j-i}$ in Equation 60.

$$\bar{y}_{t+j} = \sum_{i=1}^{j} \alpha_i(\rho_{t+j-i} \otimes \bar{y}_{t+j-i}) + \qquad \text{Equation 82}$$

$$\sum_{i=j+1}^{\ell} \alpha_i(\rho_{t+j-i} \otimes y_{t+j-i}) + \sum_{i=j+1}^{\ell} \beta_i(\rho_{t+j-i} \otimes u_{t+j-i}) \qquad \text{Equation 83}$$

The expression for $\tilde{y}y_{t+j}$ agrees with Equation 76, which proves Lemma 1, and Equation 82-83 is precisely the recursive form of the matrix equation 78 that proves Theorem 5.

Since equation 78 for the Quasi-LPV case is identical to the equation Equation 60 for the Strict-LPV case, the compact form of the equation given by Equation 64 also applies to the Quasi-LPV case. In particular, the discussion following Equation 64 also applies, so a LTI CVA of the past and corrected future determines the state of the nonlinear state affine system.

However, the behaviors of the Strict-LPV and Quasi-LPV systems can be considerably different, since the Strict-LPV system is a linear (time/parameter varying) input-output system and the Quasi-LPV system can be a bilinear input-output system that is far from linear. For the Quasi-LPV systems, considerable nonlinearity can be "hidden" in the scheduling functions if they are functions of the states.

Note that Theorems 3 and 5 provide a new tool for dealing with static dependence. In the case of no noise and full state order, these theorems guarantee that the state affine model has exactly the same input-output map so there is static dependence. However, in the case of output noise, the optimal selection of state order is determined by the minimum AIC that is an optimal multiple comparison that minimizes the Kullback information in small samples, such that any other choice will lead to worse outcomes. There appear to be no other methods available to deal with dynamic dependence in the presence of noise.

Then, in still a further exemplary embodiment, affine nonlinear systems may be identified. Below some of the issues and results relevant to system identification and the nonlinear CVA method for system identification are described.

Affine nonlinear systems have the property of a universal approximator that is of considerable importance. Given any LTI system, it is possible to approximate any such system by choosing a sufficiently high state order system as an approximator. A similar property is available for approximating continuous nonlinear systems by state affine (polynomial) systems.

The universal approximation property of state affine systems gives the opportunity to devise a systematic approximation procedure. In the context of CVA nonlinear subspace identification, the universal approximation property applies to both the affine approximation of an continuous input-output difference equation description as well as a state affine approximation. The CVA procedure starts with obtaining an (N)ARX-LPV input-output description by solving a simple linear regression computation and then using the CVA-LPV method to obtain a LPV-state space model description. In particular, the state affine form is exactly a bilinear form with higher order polynomials in the inputs as parameter-varying functions.

Then, the nonlinear model structures may be fitted and compared. In fitting the ARX-LPV models, the maximum likelihood estimates of the parameters $\alpha_i$, $\alpha_i$, 1 and $\Sigma_{vv}$ are given by treating the augmented data as if it were inputs $u_t$ and outputs $y_t$ from an (N)ARX model. In computing the (N)ARX-LPV model, the computation can be structured in an order-recursive fashion so that models are successively computed for ARX orders 1, 2, ..., maxord, using efficient methods that require little additional computation over that of computing only the highest order maxord. This can include the computation of the Akaike information criteria (AIC) for each ARX-LPV model order fitted, that can subsequently be used to select the optimal ARX-LPV order by choosing the minimum AIC. If the optimal order is close to the maximum order considered, then the maximum order, maxord, can be increased such as by doubling and the AIC for the resulting higher orders evaluated and the new minimum AIC determined.

This same order-recursive method allows for comparing any nested models consisting of subsets of PV functions $\rho_t = [\rho_t(1); \ldots; \rho_t(s)]$. This allows for highly efficient fitting and comparison of nested hypotheses such as subset selection using the leaps and bounds method and nested ordering. For example in the nonlinear extension described above, the polynomial degree J of the Taylor expansion specifies the hypothesis $H_J$ corresponding to $\rho_t = [1; u_t^{(1)}; \ldots; u_t^{(J-1)}]$ to produce the nested sequence $H_0 \subset H_1 \subset \ldots H_J$.

For each model structure $H_\rho$ depending on structural parameters of p considered in the ARX-LPV model fitting, automatic computation of the optimal ARX-LPV order l is performed and the AIC is evaluated for multiple comparison of the hypotheses.

In implementing the CVA procedure above for fitting SS-LPV models, a sequence of nested state estimates is obtained and the AIC computed for comparison of various state orders. The model state order reduction by CVA can be considerable, especially for the bilinear models since the Kronecker product state can have considerable redundancy that includes differently labeled monimials like $x_1 x_3^4 x_2^3$ and $x_3^4 x_1 x_2^3$.

The computational requirements for the subspace identification of SS-LPV models is dominated by the dimension $\dim(p_t)$ of the augmented past $p_t$. For the LPV case, $\dim(p_t)$ is the factor $\dim(\rho_t)$ larger than for the LTI case for the same length l of the past. The major computation is the CVA that is proportional to $[\dim(p_t)]^3$, so the computation increases by the factor $[\dim(\rho_t)]^3$. For bilinear systems, $[\dim(\rho_t)]$ grows exponentially as $[\dim(u_t)]^{(J-1)}$.

In another exemplary embodiment, subspace identification of an aircraft linear parameter-varying flutter model may be described. The following description and figures are exemplary in nature and other manners of utilizing the technology and embodiments described herein are envisioned.

The process of system identification of an linear parameter-varying (LPV) system using subspace techniques is demonstrated by application to the widely used pitch-plunge model of an aircraft flutter simulation. The identification is done using a recently published subspace identification (SID) algorithm for LPV systems. The objective is to demonstrate the ability of this method to not only identify a highly accurate model in state space form, but to also determine the state order of the system. As the identification data are gained from simulation, a comparison is given between the noiseless and the noisy case, and the effects of noise especially on the model order estimation are discussed.

In another exemplary embodiment, linear-parameter-varying (LPV) systems have been utilized in research as well as in control application. One attraction of LPV systems is the possibility of determining a global model over an extended region of the operating parameter space based on data in a limited region of the operating parameter space. For an aircraft simulation, for example, this permits the prediction and extrapolation of the flight characteristics into regions of the operating parameter space where no actual data was previously available.

For a fixed operating point, LPV systems behave like a linear and time-invariant (LTI) system. If the operating point changes, the parameters of the linear dynamics change by functions of the operating point. An example that is easy to visualize is a spring, mass, and damper system with linear dynamics. If this is part of a vehicle is travelling down a road, then the response in the system depends to a great degree on the speed of the vehicle. In effect, the forces from the road are speed dependent and scaled by functions of the speed. More generally, the states and inputs of the LTI system are multiplied by functions of the operating point and feed back into the LTI system. The dynamics remain LTI independent of the operating point (i.e. speed in the example). This is the fundamental structure of LPV systems. In fact, the feedback scaling is governed by the laws of physics expressed as a function of the operating point.

As described herein and with the below exemplary embodiments, subspace methods, where the order and parameters are unknown, are utilized and a state-space described description can be formed as a result of the identification process.

Subspace identification (SID), or subspace-based state-space system identification (4SID) at length, denotes a class of black-box identification methods that estimate non-iteratively the order as well as the parameters of a dynamic system. Classical algorithms in this class of identification methods are canonical variate analysis (CVA), numerical algorithms for subspace-based state-space system identification (N4SID), multivariable output error state space identification (MOESP) and predictor-based subspace-identification PBSID), which in their basic versions all result in a discrete-time state-space description of a LTI system.

Additionally, there exist several extensions of the above mentioned SID methods for special classes of nonlinear systems, bilinear systems, or LPV systems. The MOESP algorithm is based on the MOESP method, whereas the PBSID algorithms are based on PBSID. The main drawback of these LPV algorithms using the classical background of LTI subspace identification is the exponentially growing size of the matrices depended on the number of past lags, which should be at least as high as the system order, as well as the lack of an integrated and reliable order selection criterion. These drawbacks are also inherited by a recursive variant of the LPV-PBSID proposed in, where size of the data matrices is at least independent of the number of data samples.

To reduce the size of the data matrices within the algorithms, kernel versions of the LPV-MOESP and LPV-PBSID, respectively can be introduced. Still, the memory requirements of those algorithms remain high for LPV systems. Depending on the number of samples and scheduling parameters, already a past horizon of 10 or below can be challenging or infeasible on today's high end PCs.

New subspace methods addressing the memory consumption issue are proposed based on CVA. These new LPV subspace methods have computational requirements similar to subspace identification methods for linear time-invariant models, except that the number of 'lagged variables' is multiplied by one plus the number of parameter-varying functions. These methods produce statistically optimal models having high accuracy when there is sufficient signal-to-noise ratio and data length. For demonstrating the LPV subspace identification process, the new methods from are applied to data of a pitch-plunge simulation in this contribution.

This exemplary embodiment can provide a short review on the used CVA-based LPV subspace method. Then pitch-plunge model may be introduced and identification results for a noiseless case as well as for a data set including measurement noise can follow.

In this exemplary embodiment, with the idea of LPV-CVA, similar to other LPV subspace approaches, it may be desired to rewrite the LPV identification problem in a form that the LTI methods can be applied. CVA for LTI systems is a statistically based subspace identification approach Related LTI methods and their asymptotic equivalence to CVA may be utilized for the case of no noise or white noise, as well as for the case of arbitrary inputs and feedback.

LPV system identification using CVA can involve the following steps: fitting ARX-LPV models of sufficiently high order and compute the AIC for each order to determine the optimal order; removing the effects of future inputs on future outputs using the optimal ARX-LPV model order to determine the corrected future; doing a CVA between the past and corrected future to determine optimal candidate state estimates, sorting these estimates by their predictive ability, i.e. correlation with future; computing the AIC for each state order to select the optimal state order; and computing SS-LPV models for the optimal state order and other state orders of possible interest.

Examples of a LPV pitch and plunge aeroelastic simulation model has been used extensively in the analysis of LPV models and in designing control systems for LPV models. In its simplest form, this model is a 4-state, 1-input, 2-output system.

In the present example, the wing flutter consists of a 2-degree of freedom rigid body that is conceptually an aircraft wing with a movable trailing-edge flap. The system input is the flap angle $\beta$ with respect to the wing that is used to control the wing angle of attack $\alpha$ with respect to the free-stream air flow, and the two output measurements are altitude h of the wing center of gravity and wing pitch $\alpha$. The input $\alpha$ is gaussian random noise to provide persistent excitation insuring identifiability of the model parameters.

The continuous-time differential equations are well documented in the literature. Here, the particular equations from are used:

$$\begin{bmatrix} m & mx_\alpha b \\ mx_\alpha b & I_\alpha \end{bmatrix} \begin{bmatrix} \ddot{h} \\ \ddot{\alpha} \end{bmatrix} + \begin{bmatrix} c_h & 0 \\ 0 & c_\alpha \end{bmatrix} \begin{bmatrix} \dot{h} \\ \dot{\alpha} \end{bmatrix} + \begin{bmatrix} k_h & 0 \\ 0 & k_\alpha \end{bmatrix} \begin{bmatrix} h \\ \alpha \end{bmatrix} = \\ pU^2 b \begin{bmatrix} -c_{l_\alpha}\left(\alpha + \frac{1}{U}\dot{h} + \left(\frac{1}{2}-a\right)\frac{b}{U}\dot{\alpha}\right) - c_{l_\beta}\beta \\ -c_{m_\alpha}b\left(\alpha + \frac{1}{U}\dot{h} + \left(\frac{1}{2}-a\right)\frac{b}{U}\dot{\alpha}\right) - c_{m_\beta}b\beta \end{bmatrix} \qquad \text{Equation 84}$$

The corresponding parameters are also reprinted in Table 1.

TABLE 1

| Parameter | Value |
|---|---|
| a | −0.6 |
| b | 0.135 m |

TABLE 1-continued

| Parameter | Value |
| --- | --- |
| m | 12.387 kg |
| $k_\alpha$ | 2.82 Nm/rad |
| $c_\alpha$ | 0.180 m2kg/s |
| $c_{l_\alpha}$ | 6.28 |
| $c_{l_\beta}$ | 3.358 |
| $I_\alpha$ | 0.065 m2kg |
| $\rho$ | 1.225 kg/m3 |
| $x_\alpha$ | 0.2466 |
| $k_h$ | 2844.4 N/m |
| $c_h$ | 27.43 kg/s |
| $c_{m_\alpha}$ | −0.628 |
| $c_{m_\beta}$ | −0.635 |

The operation point of the parameter-varying system is defined by the air density $\rho$ (a function of altitude) in kg/m$^3$ and by the aircraft speed with respect to the air U in m/s.

For the purpose of validating the LPV system identification algorithm, the pitch-plunge wing flutter simulation model was used to simulate discrete-time data with a sample rate of 50 Hz at a variety of operating conditions. The advantage of this LPV model is that for a particular operating condition, the system is a simple 4-state vibrating system. As the operating conditions change, the frequencies and damping of the two modes change, so that it is simple to characterize the system at any operating condition.

For the pitch-plunge flutter model, the two parameter varying functions are rp=[$\rho$ U; $\rho$ U$^2$]. In the simulation, the air density is kept constant at the value given in Table 1, and the velocity is a ramping input value U=U$_t$=k t that is randomly switched from a positive slope k to a negative slope −k or vice versa. Also the maximum and minimum values of U$_t$ is constrained between u$_{t0}$±δu. In addition, random measurement and/or state noise is also possibly added to the above flutter simulation. The simulated velocity profile of the aircraft is shown in exemplary FIG. 6.

Figure 7:
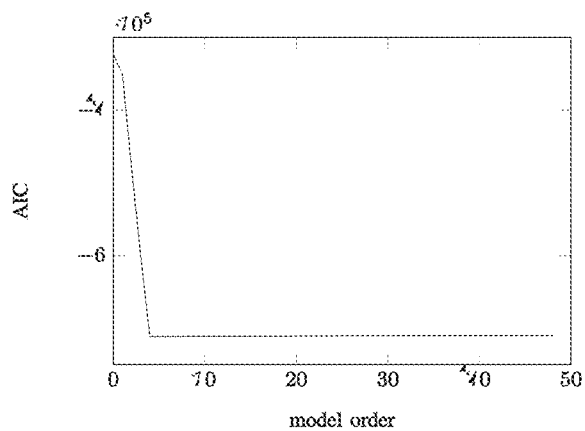
FIG. 7 is an exemplary diagram showing a pitch-plunge state-space model order selection using AIC, no noise case and where the true order is 4.
Figure 8:
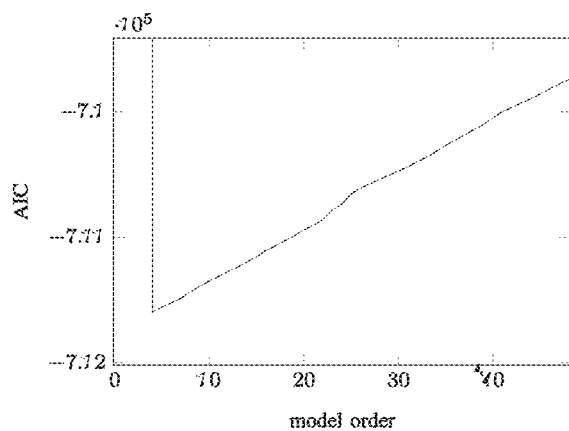
FIG. 8 is an exemplary diagram showing a detailed view of pitch-plunge state-space model order selection showing increasing AIC beyond a minimum at order 4, in a no noise case.

In this example, a simulation case where no noise is added to the simulated output measurements or states to determine the system identification accuracy with no noise present may be considered. In the LPV system identification, for each possible state space order, ord, an LPV state space model of order ord is fitted to the observed simulation data and the Akaike information criteria (AIC) measure of model fit is computed and plotted in exemplary FIG. 7, showing a pitch-plunge state-space model order selection using AIC, no noise case, and a true order of 4. A magnification of the tail beyond the true state order of 4 states is shown in exemplary FIG. 8, a detailed view of a pitch-plunge state-space model order selection showing increasing AIC beyond minimum at order 4, with no noise case. Exemplary FIG. 8 shows the AIC increasing by around 40 per state order that is slightly higher than 30, twice the number of 15 parameters per state order as predicted by the statistical theory. Thus the behavior beyond state order 4 is consistent with the theory of a random walk—that there is no statistically significant additional dynamic structure beyond order 4.

Figure 9:
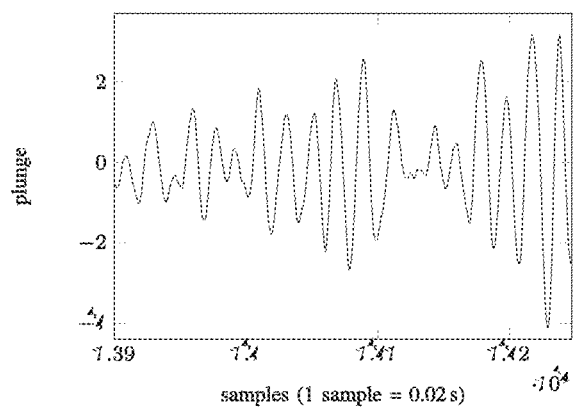
FIG. 9 is an exemplary diagram showing an LPV state-space model 20 step ahead prediction of plunge versus sample count, in a no noise case.
Figure 10:
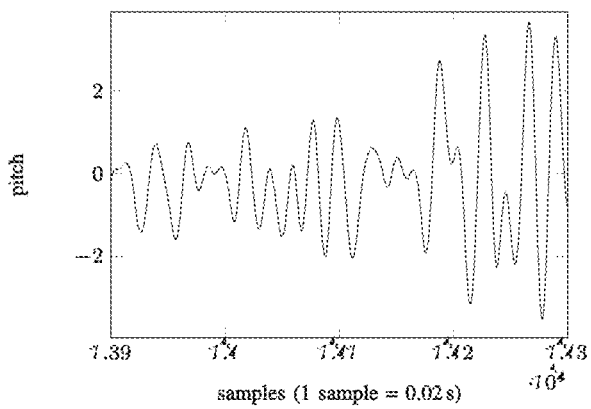
FIG. 10 is an exemplary diagram showing an LPV state-space model 20 step ahead prediction of pitch versus sample count, in a no noise case.

To demonstrate the considerable fidelity of the dynamic SS-LPV model, the multi-step prediction of the outputs plunge h and pitch α are shown respectively in exemplary FIG. 9 (an LPV state-space model 20 step ahead prediction of plunge versus the observed output, no noise case) and exemplary FIG. 10 (an LPV state-space model 20 step ahead prediction of pitch versus the observed output, no noise case) for 20 steps ahead and compared with the observed outputs. In calculating the prediction, the flap angle input β for 20 steps ahead is assumed to be known, and the 20 steps ahead is visually about one cycle of the output signal oscillation. The accuracy of this subset of 400 time samples is typical of the complete data set of 20,000 samples. Over the 400 samples, the aircraft velocity increased by about 8 percent.

The only differences between the observed and predicted output signals are the result of very small differences between the pitch-plunge simulation model and the identified state space model iterated 20 steps ahead. Notice that there is no observable systematic delay in the signal, or under-shoot or over-shoot at the peaks or troughs. The RMS error between the measured output and the 20 steps ahead predictions are about 1 percent of the respective signal RMS. This is quite remarkable since the parameters of the linear dynamic model is changing continually as nonlinear functions of the operating parameters of air density and air speed. Actually, the high precision is the result of estimating only 69 parameters of the 4-state LPV state space model using 20,000 observations. The prediction of 20 steps ahead corresponds to prediction of about one cycle ahead.

Now, consider a simulation case where white measurement noise is added to the simulation to determine its effect. In the LPV system identification, for each possible state space order, ord, an LPV state space model of order ord is fitted to the observed simulation data. The AIC measure of model fit is computed and plotted in exemplary FIG. 11 (a pitch-plunge state-space model order selection using AIC, measurement noise case) where the minimum AIC occurs essentially at state order 6. A magnification of the tail beyond state order of 6 states is shown in exemplary FIG. 12, a detailed view of the pitch-plunge state-space model order selection shows increasing AIC beyond minimum at order 6, measurement noise case. This shows that the AIC increasing by around 23 per state order that is close to twice the number of 15 parameters per state order as predicted by the statistical theory. This behavior is consistent with the theory of a random walk.

Figure 11:
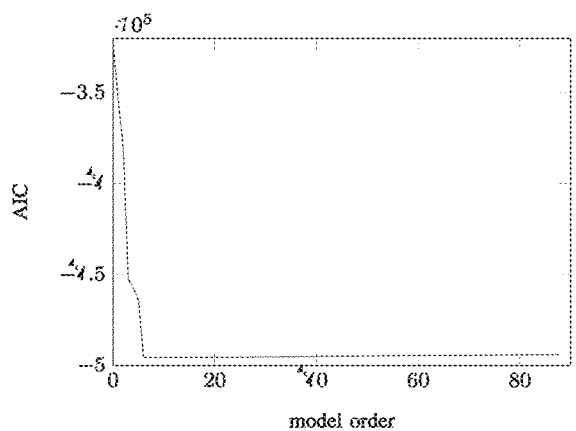
FIG. 11 is an exemplary diagram showing a pitch-plunge state-space model order selection using AIC, with measurement noise case.
Figure 12:
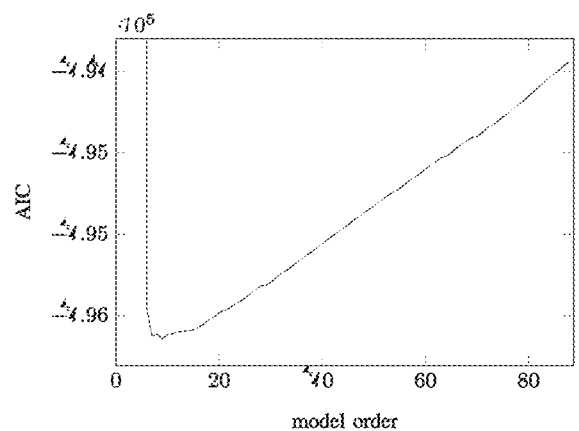
FIG. 12 is an exemplary diagram showing a view of the pitch-plunge state-space model order selection with increasing AIC beyond minimum at order 6, with measurement noise case.
Figure 13:
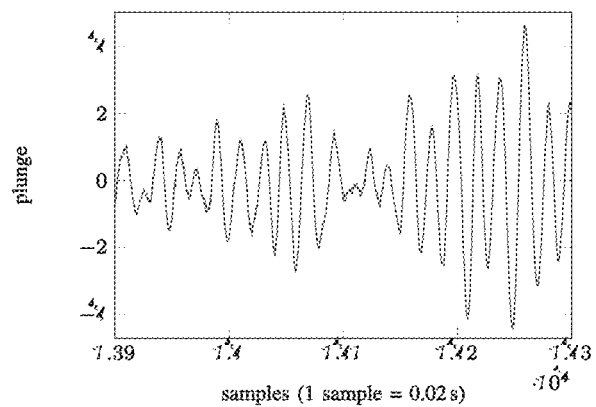
FIG. 13 is an exemplary diagram showing an LPV state-space model 20 step ahead prediction of plunge versus sample count, with measurement noise case.
Figure 14:
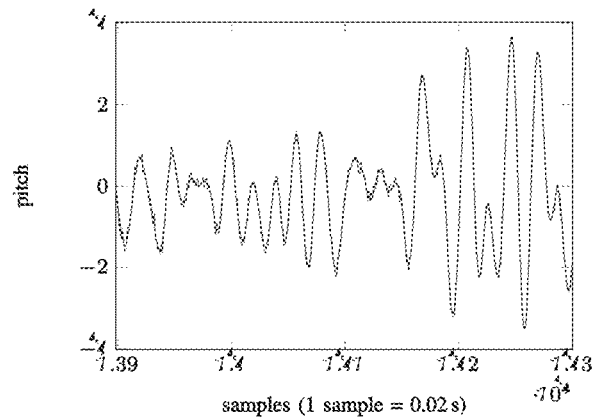
FIG. 14 is an exemplary diagram showing an LPV state-space model 20 step ahead prediction of pitch versus sample count, with measurement noise case.

Like in the case with no measurement noise in the previous subsection, the 20 steps ahead prediction for the same sector of the dataset is shown in exemplary FIGS. 11 and 12. Exemplary FIG. 13 shows an LPV state-space model 20 step ahead prediction of plunge versus the observed output, measurement noise case and exemplary FIG. 14 shows an LPV state-space model 20 step ahead prediction of pitch versus the observed output, measurement noise case. The differences between the observed output and the output predicted 20 steps ahead by the LPV state space model are primarily the result of additive white measurement noise. It is seen that the 20 steps ahead prediction provides a smoothing of the measurement noise. Notice that there is no observable systematic delay in the signal, or under-shoot or over-shoot at the peaks or troughs. The RMS error between the measured output and the 20 steps ahead predictions are about 10 percent of the respective signal RMS. This is quite remarkable since the parameters of the linear dynamic model are changing continually as nonlinear functions of the operating parameters of air density and air speed. Actually, the high precision is the result of estimating only 99 parameters of the 6-state LPV state space model using 20,000 observations. The prediction of 20 steps ahead corresponds to prediction of about one cycle ahead.

In the first case of no measurement noise described above, the state order chosen is the true state order of 4 states, while in the case of low measurement noise, the minimum occurs close to state order 6. While the input-output state order in the simulation is the true order of 4, the AIC computation determines that in this case it is necessary to use a higher state order of 6 in the LPV state space model to obtain high accuracy prediction of the dynamics in the presence of the measurement noise. An additional advantage of the statistical subspace methods is the possible use of the AIC as order selection criterion.

In another exemplary embodiment, real-time identification and monitoring of automotive engines can be performed using the systems and methods described herein. Some difficulties in previous systems of monitoring automotive engines were mainly due to the nonlinearity of the engine dynamics due to changes in the engine operating conditions. However, as shown herein, many of the powertrain subsystems are well approximated as linear parameter-varying (LPV) systems that are described as time-invariant linear systems with feedback multiplied by operating condition dependent parameters that can be measured or otherwise obtained in real time. The LPV structure has linear dynamics at a fixed operating condition, and has been shown to incorporate much of the known governing laws of physics directly into the structure of the dynamic model.

The subspace method described gives efficient solutions on larger scale problems using well understood linear time-invariant subspace methods. An added benefit is the rigorous determination of the state order of the process that can be valuable for controller implementation. The identification of engine subsystem models in LPV form can have the advantages of greatly improved accuracy, greatly reduced data requirements, and dramatic abilities to extrapolate to conditions not contained in the model fitting data. Use of accurate LPV models in other fields has led to the design of global controllers having guaranteed global stability and margin with improved performance, and monitoring methods to detect changes and faults under operating conditions not previously encountered. Potential issues are significant nonlinearities of some engine models that may benefit from the use of recently developed Quasi-LPV subspace methods. Also, to achieve the potential high identification accuracy may be use of quadruple precision computation for SVD of very large matrices, that is starting to be practical for real-time engine model identification.

The accurate modeling of automotive engines is of great value in model-based engine control and monitoring. Few methods are presently available for general nonlinear and/or parameter- or time-varying systems. Linear parameter-varying (LPV) models discussed herein have the advantage that at a fixed operating point the dynamics are linear, and the LPV model structure reduces the problem to the identification of a linear, time-invariant LTI block. Once this LTI block is determined, the dynamics at any operating point is obtained by scaling various feedback signals by predetermined functions of the operating point. This simple linear (LTI) structure with nonlinear feedback has profound implications for modeling, system identification, monitoring, and control.

The concept of a linear parameter varying-system is a major simplification with wide ranging implications for modeling, system identification, monitoring, and control. The basic concept extends deep into the fundamental laws of physics that are involved in the behavior of the system dynamics.

Many physical structures have simple subsystems that appear to be exceedingly complex when they are operated at many different operating conditions. Recent methods that parameterize the system behavior by a range of operating points can describe the system as a common linear, time-invariant (LTI) subsystem along with nonlinear interactions as functions of the operating conditions. Examples of such systems include vibrating structures, aircraft aerodynamics, chemical processes, etc.

An example is a spring, mass, and damper system with linear dynamics. If this is part of a vehicle traveling down the road, then the response depends to a great degree on the speed of the vehicle. In effect, the forces from the road are scaled by functions of the speed.

More generally, the states and inputs of the LTI subsystem are multiplied by functions of the operating condition and are fed back into the LTI subsystem. The dynamic response remains LTI independent of the speed, but the forces are speed dependent. This is the fundamental structure of LPV systems. In fact the feedback scaling may be governed by the laws of physics expressed as a function of the operating conditions.

This LPV structure is an ideal procedure for extrapolation. In nonlinear dynamic models, a fundamental problem is that there are regions of the state space that are seldom visited by the state trajectory. Without a fundamental method for extrapolation, there will be regions of the state space where the dynamics are poorly approximated. The LPV approach fundamentally circumvents this problem with the LPV model composed of an LTI subsystem involving the dynamics, and feedback involving the changes in operating condition.

The nonlinear system identification approach implemented in the canonical variate analysis (CVA) method discussed herein is based on linear parameter-varying (LPV) model descriptions. The affine state space LPV (SS-LPV) model form of this example may be used because of its parametric parsimony and for its state space structure in control applications. The ARX-LPV (autoregressive input/output) model form used for initial model fitting also plays a role and is discussed first. To simplify the development, stochastic noise in the system is not included in some of the discussions.

The first step in the CVA-LPV procedure is to approximate the LPV process by a high order ARX-LPV model. As it is well know and often done, an LPV dynamic system may be approximated by a high order ARX-LPV system of the form:

$$y_t = \sum_{i=1}^{\ell} \alpha_i (\rho_{t-i} \otimes y_{t-i}) + \sum_{i=0}^{\ell} \beta_i (\rho_{t-i} \otimes u_{t-i}) + v_t \qquad \text{Equation 85}$$

that gives a linear prediction of the present output $y_t$ at time t in terms of the past outputs $y_{t-i}$ and past and possibly present inputs $u_{t-i}$, where l is the order of the ARX-LPV process, and $v_t$ is a white noise process with covariance matrix $\Sigma_{vv}$. The lower limit of the second sum is equal to 1 if the system has no direct coupling between input and output, i.e. $\beta_0 = 0$.

Notice that the time shift t−i in the scheduling functions $\rho_{t-i}$ matches those in the inputs $u_{t-i}$ and outputs $y_{t-i}$ in the ARX-LPV equations 85. This is not arbitrary but necessary to avoid the introduction of dynamic dependence in the resulting state space LPV description to be derived from the ARX-LPV model.

Notice that in Equation 85, the parameter-varying functions $\rho_{t-i}$ can be associated, i.e., multiply either with the constant matrix coefficients $\alpha_i$ and $\beta_i$ or the data $y_t$ and $u_t$. In the first case, the result is the parameter-varying coefficients $\alpha_i(\rho_{t-i} \otimes I_y)$ and $\beta_i(\rho_{t-i} \otimes I_u)$ respectively to be multiplied by $y_{t-i}$ and $u_{t-i}$, where the dimensions of the identity matrix $I_y$ and $I_u$ are respectively the dimensions of y and u. In the second case, since the time shift t−i is the same in all the variables $y_{t-i}$, $u_{t-i}$ and $\rho_{t-i}$, the augmented data $\{\rho_t \otimes y_t, \rho_t \otimes u_t\}$ can be computed once for each time t and used in all subsequent computations.

The association of the PVs with the data allows the direct adaptation of the CVA subspace system identification method for linear time invariant (LTI) systems to LPV systems including all of the computational and numerical advantages of the LTI method. In particular, the ARX-LPV equations become LTI in the augmented data, and calculation of the coefficient estimates for the ARX-LPV model is nearly the same as for an ARX-LTI model using the augmented data. In particular, the estimation of the coefficient matrices α and β from the augmented data involve solving a strictly linear equation.

Consider a linear system where the system matrices are time varying functions of a vector of scheduling parameters $\rho_t = [\rho_t(1); \rho_t(2); \ldots; \rho_t(s)]$, also called parameter-varying (PV) functions, of the form:

$$x_{t+1} = A(\rho_t)x_t + B(\rho_t)u_t \quad \text{Equation 86}$$

$$y_t = C(\rho_t)x_t + D(\rho_t)u_t \quad \text{Equation 87}$$

In this example, as usual in much of the literature only LPV systems are considered having affine dependence on the scheduling parameters of the form $A(\rho_t) = \rho_t(1)A_1 + \cdots + \rho_t(s)A_s$ and similarly for $B(\rho_t)$, $C(\rho_t)$, and $D(\rho_t)$. Here the parameter-varying matrix ($A\rho_t$) is expressed as a linear combination specified by $\rho_t = [\rho_t(1); \rho_t(2); \ldots; \rho_t(s)]$ of constant matrices $A = [A_1 \ldots A_s]$, called an affine form and similarly for B, C, and D.

To simplify the discussion, the LPV equations can be written in several simpler forms by associating the scheduling parameters $\rho_t$ with the inputs $u_t$ and states $x_t$ analogous to the ARX-LPV case to obtain the form:

$$\begin{pmatrix} x_{t+1} \\ y_t \end{pmatrix} = \begin{pmatrix} A & B \\ C & D \end{pmatrix} \begin{pmatrix} \rho_t \otimes x_t \\ \rho_t \otimes u_t \end{pmatrix} + \begin{pmatrix} w_t \\ v_t \end{pmatrix} \quad \text{Equation 88}$$

where ⊗ denotes the Kronecker product M⊗N defined for any matrices M and N as the partitioned matrix composed of blocks i,j as $(M \otimes N)_{i,j} = m_{i,j}N$ with the i,j element of M denoted as $m_{i,j}$, and $[M; N] = (M^T N^T)^T$ denotes stacking the vectors or matrices M and N.

Other available methods for LPV system identification involve iterative nonlinear optimization and nonlinear subspace methods where the computation time grows exponentially with linear growth in the size of the inputs, outputs, state, and scheduling function, i.e. model complexity. These difficulties are avoided by the use of these new LTI subspace methods for identifying LPV systems.

The exemplary data used for gas engine air-fuel ratio modeling may be based on a 6.2 L V8 engine with dual-equal cam phasers. Subsystems studied involved LPV models of the intake manifold (IM) and the fuel/lambda path as shown in the block diagram of exemplary FIG. 15. The block diagram has two dynamic LPV blocks (1002 and 1004) interconnected with static nonlinear blocks and followed by a delay block. These dynamic LPV models are discussed in more detail below.

A strategy may be to determine dynamic blocks with LPV structure having measurable input and output variables and known or accurately measurable operating conditions. Also, it may be assumed that the inputs to such blocks have no significant noise. Then using the CVA-LPV systems identification methods, such LPV dynamic input/output blocks are identifiable with sufficient input excitation since these methods are maximum likehood and optimal.

Very high accuracy in parameter estimation is possible using the CVA LPV subspace method, but to realize the accuracy it may require the use of Quadruple (Quad) precision of more than 30 decimal places. Even for the simple aircraft flutter problem of 1-input, 2-outputs, 4-states and 2-scheduling functions, canonical correlations computed in double precision using SVDs of 500 by 20,000 data matrices produced canonical correlations larger than 0.999999999, that retains less than 6 decimal places and often less than 4 places. Such a calculation can be made in 5 minutes or significantly faster, for example 5 seconds using currently available Graphical Processing Units (GPUs) hardware.

A second issue related to combustion engines is potentially large nonlinearities so that the systems are not Strict-LPV but rather Quasi-LPV. The nonlinearities will be shown directly from a widely used state-space engine simulation model. This means that the engine model may actually be bilinear or polynomial which involves Quasi-Scheduling functions that are functions of the dynamic variables of inputs $u_t$, outputs $y_t$, and/or $x_t$. The recently developed LPV CVA subspace system identification method was extended to the Quasi-LPV case.

As discussed below, two different methods are used for determining parameter-varying scheduling functions $\rho_t$. In the first, computation of numerical values of the functions may be done using a nonlinear simulation calculating the time-varying elements of state space coefficient matrices. The second may be the analytical determination of the nonlinear functional form of the coefficients of the difference equations.

Figure 15:
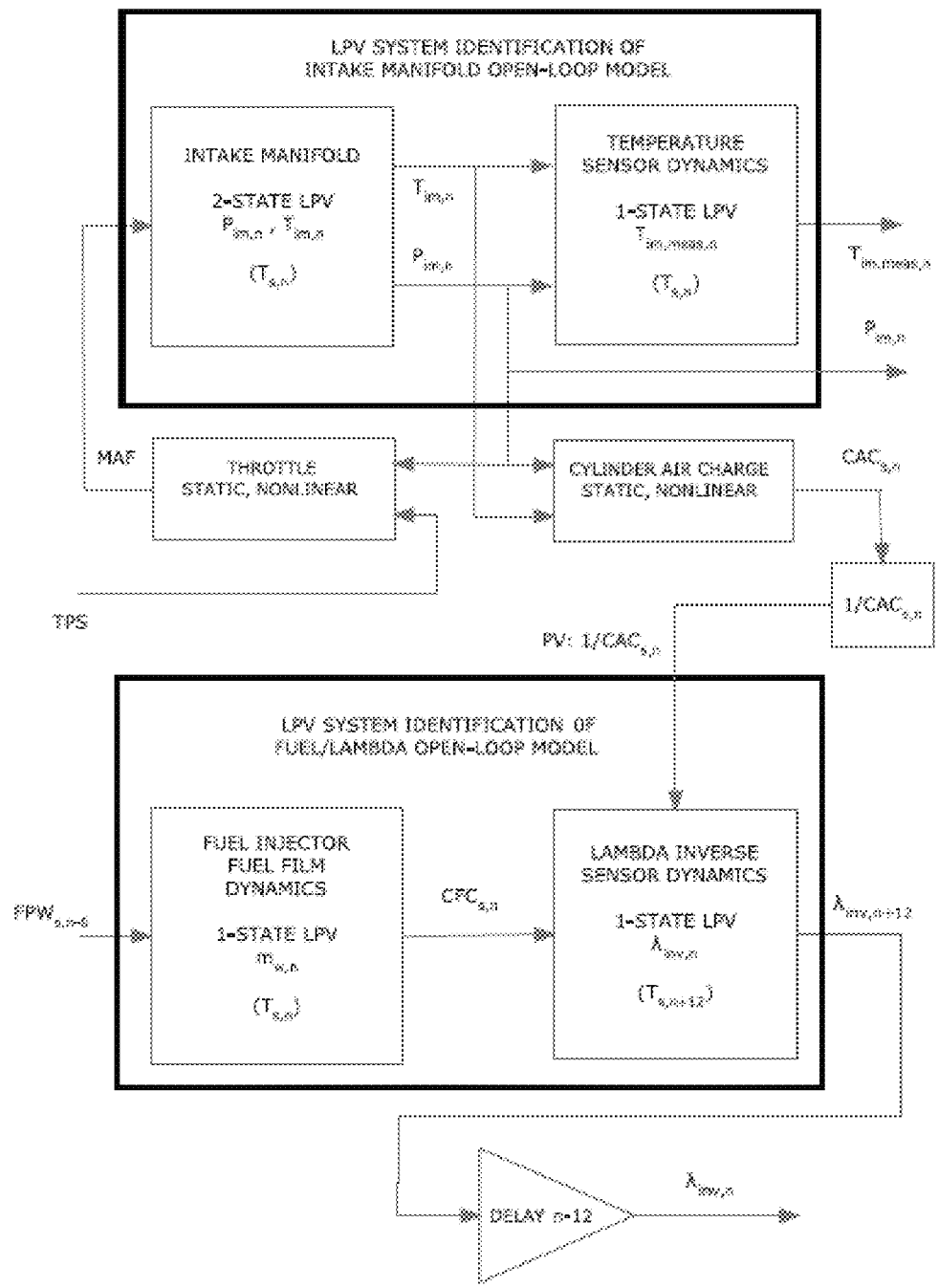
FIG. 15 is an exemplary diagram showing an LPV system identification of a delay compensated intake manifold and fuel injection models.

A simplified Intake Manifold is shown in exemplary FIG. 15 that includes the electronic throttle as part of the throttle dynamics and flow block. The electronic throttle is driven by an electric motor and is locally controlled by a dedicated controller that may be modeled by a second-order linear system. This additional LPV system is also easily modeled from input throttle Angle set point $TA_{SP}$ to output Throttle Angle α measured by the Throttle Position Sensor TPS.

The input is manifold throttle air-flow $\dot{m}_{at}$, also denoted MAF, and the throttle heat flow $\dot{Q}_{ext}$ is a simple function of $T_{im}$ expression below. With the elements of matrices (A, B, C, D) explicitly expressed as parameter varying (PV) scheduling functions of various temperatures, pressures, mass flows, engine RPM, input throttle command, and sampling time interval. These scheduling functions have considerable nonlinearities. Because of the availability of the Simulink model it may not be necessary to explicitly implement the computation of these scheduling functions since they were implicitly available in the simulation model. Moreover, there is an additional state in the Intake Manifold model for the temperature measurement $T_{im,meas}$.

As shown in exemplary FIG. 15, the intake manifold open-loop dynamic model is expressed as a LPV state space model of order 3 involving the states of intake manifold pressure $P_{im}$, intake manifold temperature $T_{im}$, and measured intake manifold temperature $T_{im,meas}$, expressed below as difference equations:

$$P_{im,n+1} = \left(1 - \frac{\kappa V_{cyl}}{V_{im}}\eta_n\right)T_{im,n} + \frac{\kappa - 1}{V_{im}}T_{s,n}\dot{Q}_{ext} + \frac{\kappa R_{air}T_{a,n}}{V_{im}}T_{s,n}\dot{m}_{at,n} \quad \text{Equation 89}$$

-continued $$T_{im,n+1} = \left(1 - \frac{\kappa V_{cyl}}{V_{im}}\eta_n\left(1-\frac{1}{\kappa}\right)\right)T_{im,n} + \frac{T_{im,n}(\kappa-1)(T_{s,n})}{V_{im}P_{im}(k)}\dot{Q}_{ext} +$$
$$\left(T_{im,n}\frac{\kappa R_{air}T_{a,n}}{V_{im}P_{im,n}} - T_{im,n}^2\frac{R_{air}}{V_{im}P_{im,n}}\right)T_{s,n}\dot{m}_{at,n}$$

Equation 90

$$\dot{Q}_{ext} = h_1(T_{coolant} - T_{im}) + h_2(T_a - T_{im})$$ Equation 91

$$T_{im,meas,n+1} = a_T T_{im,meas,n} + b_T[P_{im,n}; T_{im,n}]$$ Equation 92 where $\dot{Q}_{ext}$ is a surrogate for $T_{im}$ and expresses the heat transfer rate from the intake manifold, and the last equation expresses the temperature sensor discrete time dynamic model.

The variables in the state equations are upstream pressure (ambient) $P_a$, upstream temperature (ambient) $T_a$, coolant temperature $T_{coolant}$, downstream pressure (intake manifold) $P_{im}$, ratio of specific heats for dry air $\kappa$, and ideal gas constant for dry air $R_{air}$.

Notice the coefficients multiplying the states manifold downstream pressure $P_{im}$, manifold air temperature $T_{im}$, measured manifold air temperature $T_{im,meas}$, and serogate heat transfer rate $\dot{Q}_{at}$ are corresponding elements of the A matrix of the state equations. Similarly, coefficients multiplying the input throttle mass air-flow $\dot{m}_{at}$, correspond to the B matrix. The coefficients associated with $\dot{m}_{at}$ particularly involve the dynamic variables of inputs, outputs, and states.

The strategy in identifying the intake manifold is to obtain a high accuracy input $\dot{m}_{at}$, shown as MAF in FIG. 15. That this is possible has been verified for all but very exceptional situations. The input $\dot{m}_{at}$ is obtained as the output of the throttle static nonlinearity with inputs of throttle position sensor (TPS) and feedback of $P_{im}$ as in FIG. 1. The subspace LPV system identification will then obtain an unbiased openloop dynamic model for the intake manifold with outputs $P_{im}$, $T_{im}$, and $T_{im,meas}$.

The Simulink model describes a discrete-time linearized state space model of the throttle/intake manifold that is a time varying 3-state system of the following form:

The continuous-time electronic throttle (ET) model is a linear time-invariant system. The corresponding discrete-time model parameters will vary with engine speed, with the sampling period $T_{s,n}$ related to engine speed $N_n$ by $T_{s,n}=120/(8N_n)$ where $N_n$ is in revolutions per minute at the discrete event n.

As shown below, this implies that the electronic throttle discrete-time model is LPV with parameter-varying function $T_{s,n}$ and to first order and asymptotically for large sample $A_{ET,n}=I+F_{ET}T_{s,n}$ and $B_{ET,n}=G_{ET}T_{s,n}$ where $F_{ET}$ is the continuous time state transition matrix corresponding to $A_{ET,n}$ and similarly for $B_{ET,n}$ and $G_{ET}$. As a result, the sampling period $T_{s,n}$ is one of the scheduling functions obtained by considering elements of $A_n$.

The output measurements of TPS, $\dot{m}_{at}$, and $T_{im}$ are obtained from direct measurement of the respective states plus measurement noise so that the C matrix is a constant. The D matrix is zero.

The throttle/intake manifold Simulink model explicitly computes the elements of the discrete-time state transition matrix $A_n$ in terms of available operating-point variables. A unique subset of these discussed below specify the Scheduling functions of the LPV model.

The Simulink LPV model can compute each of the elements in the state space model matrix $A_n$ which explicitly provides a set of parameter-varying functions of the LPV model. There is some redundancy among all the possible elements that was determined by computing the correlation matrix among all 25 elements of $A_n$. Table 2 denotes the elements as constant C, duplicate D with high correlation, or unique representative U. The constants C had standard deviation that was 0 to machine precision. Sets of duplicate elements had a correlation coefficient of 0.9908 so the first was taken as the unique representative U and the second as the duplicate D. Elements $a_{2,1}$, $a_{2,4}$, $a_{3,1}$, $a_{4,4}$ had correlation 1 with $a_{3,1}$ taken as the unique representative U, and similarly for $a_{5,1}$, $a_{5,2}$ with $a_{5,1}$ the unique representative U. The other unique elements were $a_{2,2}$ and $a_{3,2}$. The correlation matrix among all the unique elements in the vector [$a_{1,1}$; $a_{2,2}$; $a_{3,1}$; $a_{3,2}$; $a_{5,1}$] is shown in Table 3.

TABLE 2

| U | D | C | C | C |
|---|---|---|---|---|
| D | U | C | D | C |
| U | U | C | C | C |
| C | C | C | D | C |
| U | D | C | C | C |

TABLE 3

|  | $a_{1,1}$ | $a_{2,2}$ | $a_{3,1}$ | $a_{3,2}$ | $a_{5,1}$ |
|---|---|---|---|---|---|
| $a_{1,1}$ | 1.0000 | −0.1481 | −0.3861 | −0.1583 | 0.0647 |
| $a_{2,2}$ | −0.1481 | 1.0000 | 0.7659 | 0.8664 | 0.7796 |
| $a_{3,1}$ | −0.3861 | 0.7659 | 1.0000 | 0.9410 | 0.5616 |
| $a_{3,2}$ | −0.1583 | 0.8664 | 0.9410 | 1.0000 | 0.7639 |
| $a_{5,1}$ | 0.0647 | 0.7796 | 0.5616 | 0.7639 | 1.0000 |

Parameter varying functions corresponding to the various subsystem dynamics are given in Table 4 for the delay-compensated engine Simulink model.

The complete intake manifold and fuel/lambda subsystem is shown in FIG. 13. The intake manifold provides the air for in-cylinder combustion quantified in the variable cylinder air charge $CAC_{s,n}$ while fuel is provided in the fuel injector and film dynamics block quantified as Fuel Pulse Width $FPW_{s,n}$. A critical quantity to control is the air-fuel ratio denoted as $\lambda_{s,n}$ and measured in the exhaust gases prior to the catalytic converter as fuel-air ratio called lambda inverse and denoted $\lambda_{INV,n}$. Both fuel injection FPW and measurement of $\lambda_{INV,n}$ involve substantial delays as indicated in FIG. 15.

To eliminate the delays, the input fuel pulse width FPW to the fuel injector and film dynamics block can be delayed by 6 events relative to the time base $T_{s,n}$ that is expressed as $FPW_{s,n-6}$. Also notice that due to the 12 event exhaust-gas transport delay, the time base in the Lambda Inverse Sensor Dynamics block is 12 events ahead of the input CFC. Thus by eliminating the delay of 12 in CFC and advancing the time base in the block by 12 events produces the same result except that the output $\lambda_{inv,n+12}$ is advanced by 12 events. This removes the delays and preserves the dynamics within each block. In addition, the parameter varying functions entering the lambda inverse sensor dynamics block need to be advanced by 12 events as well.

The removal of delays is a major simplification of the system identification problem when using subspace system identification methods. Since delays of 6 plus 12 events is a total of 18 events, the delays increase the state order from a total of 5 states without delays to a total of 23 states with delays. Computation time using subspace identification methods tend to increase as the cube of the state order.

Using the above simplification to remove the pure delays in FPW and λ allows the Fuel-Lambda path to be expressed as the 2-state system:

$$m_{w,n+1} = \left(1 - \frac{T_{s,n}}{\tau_n}\right) m_{w,n} + X_n k_{fi,n-6} FPW_{off,n} \quad \text{Equation 93}$$

$$\lambda_{INV,n+13} = \left(1 - \frac{T_{s,n+12}}{\tau_{\lambda inv,n+12}}\right) \lambda_{INV,n+12} + \quad \text{Equation 94}$$

$$\frac{T_{s,n+12}}{\tau_{\lambda inv,n+12}} \frac{AF_{stoich}}{CAC_n} \left[\frac{T_{s,n}}{\tau_n} m_{w,n} + (1 - X_n) k_{fi,n} FPW_{off,n-6}\right]$$

The input in this 2-state Fuel-Lambda Path subsystem is the offset in FPW, $FPW_{off,n}$, the output is the measured Lambda inverse, $\lambda_{INV,n+12}$, and the states are mass of the fuel wall, $m_{w,n}$ and $\lambda_{INV,n+12}$. The parameters r and X are operating condition dependent parameters of the process.

The parameter varying functions of the 2-state Fuel-Lambda model of equations 93 and 94 are given in Table 4. It may be noticed that PV functions in rows (3) and (4) of the Table involve products of factors with differing time delays. This may seem unusual, but is rigorously developed here in the context of a delayed LPV dynamic system. Thus, a LPV representation can also be a powerful tool for removing delays from a discrete-time delayed LPV system and reduce the state order considerably. Finally, following the output $\lambda_{INV,n+12}$ of this system with a delay of 12 events produces the delayed output $\lambda_{INV,n}$.

TABLE 4

| Row | Scheduling Function | Delay Variable |
|---|---|---|
| (1) | $X_n k_{fi,n}$ | |
| (2) | $\left(1 - \frac{T_{s,n}}{\tau_n}\right)$ | |
| (3) | $\frac{T_{s,n+12}}{\tau_{\lambda inv,n+12}} \frac{AF_{stoich}}{CAC_n}(1 - X_n) k_{fi,n}$ | $(FPW - 0)_{fi,n-6}$ |
| (4) | $\frac{T_{s,n+12}}{\tau_{\lambda inv,n+12}} \frac{AF_{stoich}}{CAC_n} \frac{T_{s,n}}{\tau_n}$ | $\lambda_{INV,n+12}$ |
| (5) | $\left(1 - \frac{T_{s,n+12}}{\tau_{\lambda inv,n+12}}\right)$ | |

In this example, the application of a new method for system identification of

LPV systems to modeling automotive engines from measured data is presented. Past methods for LPV system identification have only been applied to systems with few dynamic variables and few scheduling functions. The LTI subspace identification methods potentially scale to much larger and complex LPV and Quasi-LPV systems.

A detailed study of high fidelity LPV engine Simulink models was also provided with respect to these exemplary embodiments. The two subsystems discussed were the intake manifold and the Fuel-Lambda path. Two different approaches were taken, one involving the use of the Simulink model to compute the scheduling functions, and the other using directly the analytic expressions underlying the Simulink model.

There are two major issues that are characteristic to some LPV model types and to some engine subsystems. The intake manifold is quite nonlinear which means the scheduling functions are functions of the dynamic variables of inputs, outputs, and/or states rather than linear functions of known exogenous operating condition variables. This can potentially introduce large estimation error into the identification procedure. The other issue is the extreme high accuracy that may potentially be possible since the scheduling functions are encoded with considerable information about the highly complex engine behavior. As a result, some engine parameters can potentially be estimated with very high accuracy. But to take advantage of this may require quadruple precision computation.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A method of forming a dynamic model for the behavior of machines from sensed data, comprising:
    observing, with at least one sensor, a combustion engine in operation;
    recording data from the at least one sensor about at least one characteristic of the combustion engine in operation;
    fitting at least one of an autoregressive input-output linear parameter-varying dynamic model and an autoregressive input-output nonlinear parameter-varying dynamic model, each model having a state order above a predetermined threshold, to the recorded combustion engine data;
    removing effects of future inputs from future outputs to generate corrected future outputs by using at least one of the fitted autoregressive input-output linear parameter-varying dynamic model and the fitted autoregressive input-output nonlinear parameter-varying dynamic model;
    performing, to reduce a computational size of at least one of the fitted autoregressive input-output linear parameter-varying dynamic model and the fitted autoregressive input-output nonlinear parameter-varying dynamic model, a canonical variate analysis (CVA) between the corrected future outputs and past outputs of at least one of the fitted autoregressive input-output linear parameter-varying dynamic model and the fitted autoregressive input-output nonlinear parameter-varying dynamic model;
    constructing at least one of a dynamic linear parameter varying state-space model and a dynamic nonlinear parameter varying state-space model based on the performed CVA;
    generating a dynamic model of combustion engine behavior; and
    at least one of controlling and modifying combustion engine dynamic response characteristics based upon the generated dynamic model of combustion engine behavior, wherein the CVA is performed according to the equation:

$$y_t = \sum_{i=1}^{\ell} \alpha_i (\rho_{t-i} \otimes y_{t-i}) + \sum_{i=0}^{\ell} \beta_i (\rho_{t-i} \otimes u_{t-i}) + v_t$$

wherein $y_t$ is a linear prediction of a present output, $\alpha_i$ and $\beta_i$ are parameter-varying coefficients, $\rho_{t-i}$ is a parameter varying scheduling function, $y_{t-i}$ and $u_{t-i}$ are dimensions of identity matrices, t is time, $v_t$ is a white noise process of a covariance matrix, l is an order of the autoregressive input-output linear parameter-varying process.

2. The method of forming a dynamic model for the behavior of machines from sensed data of claim 1, further comprising:
eliminating an undesired characteristic of machine behavior.

3. The method of forming a dynamic model for the behavior of machines from sensed data of claim 2, wherein the eliminated characteristic of machine behavior is vibration.

4. The method of forming a dynamic model for the behavior of machines from sensed data of claim 2, further comprising modifying one or more signals in a control system computer of the machine.

5. The method of forming a dynamic model for the behavior of machines from sensed data of claim 4, wherein the one or more signals in the control system computer of the machine is modified with feedback comprising a negative of the isolated characteristic of machine behavior.

6. The method for modifying machine dynamic response characteristics of claim 1, wherein the combustion engine has an intake manifold, wherein an input is obtained as the output of a throttle static nonlinearity with inputs of a throttle position sensor and feedback of intake manifold pressure.

7. The method of forming a dynamic model for the behavior of machines from sensed data of claim 1, wherein the autoregressive input-output linear parameter-varying dynamic model and an autoregressive input-output nonlinear parameter-varying dynamic model further comprises computing an Akaike information criteria (AIC) for each state order to determine an optimal order.

8. The method of forming a dynamic model for the behavior of machines from sensed data of claim 7, further comprising computing state space linear parameter varying (SS-LPV) models for at least the optimal state order.

9. The method of forming a dynamic model for the behavior of machines from sensed data of claim 1, wherein the dynamic model of machine behavior extends to general state affine nonlinear systems.

10. The method of forming a dynamic model for the behavior of machine from sensed data of claim 1, wherein the corrected future outputs are determined by the equation $$f_t(\bar{y}) = \alpha_f f_t(\rho \otimes \bar{y}) + [\alpha_p \beta_p] p_t,$$

wherein $\alpha_f$, $\alpha_p$, and $\beta_p$ are constants, $f_t(\bar{y})$ is a vector of corrected future outputs, $f_t$ is a vector of future outputs, $\rho$ is a scheduling parameter, $\bar{y}$ is an output sequence, and $p_t$ is a vector of augmented past outputs.

11. The method of forming a dynamic model for the behavior of machine from sensed data of claim 1, further comprising determining a maximum likelihood state order with the equation $$\log p((y|_1^N) | p_t, (u|_1^N), (\rho|_1^N), \theta) = \frac{1}{\zeta} \sum_{t=\ell+1}^{N-\ell} \log p((f_t(\bar{y}) | p_t, \theta)$$

wherein $f_t(\bar{y})$ is a vector of corrected future outputs of dimension $\zeta$, $p_t$ is a vector of augmented past outputs, l are lags, $y|_1^N$ are observed outputs, $(u|_1^N)$ In are observed inputs, and $p_t$ are initial past inputs.

12. The method of forming a dynamic model for the behavior of machine from sensed data of claim 1, further comprising extending and adapting the NARX-LPV CVA systems identification method to affine nonlinear systems comprising the following steps:
fitting NARX-LPV models of sufficiently high order and computing the AIC for each order to determine the optimal order;
removing effects of future inputs on future outputs using an optimal NARX-LPV model order to determine a corrected future;
performing a CVA between the past and corrected future to determine optimal candidate state estimates, and sorting these estimates by their predictive ability;
computing an AIC for each state order to select an optimal state order; and
computing SS-LPV models for the optimal state order and other predetermined state orders.

13. A method of forming a dynamic model for the behavior of machines from sensed data, comprising:
observing, with at least one sensor, an aircraft in operation;
recording data from the at least one sensor about at least one characteristic of the aircraft in operation;
fitting at least one of an autoregressive input-output linear parameter-varying dynamic model and an autoregressive input-output nonlinear parameter-varying dynamic model, each model having a state order above a predetermined threshold, to the recorded aircraft data;
removing effects of future inputs from future outputs to generate corrected future outputs by using at least one of the fitted autoregressive input-output linear parameter-varying dynamic model and the fitted autoregressive input-output nonlinear parameter-varying dynamic model;
performing, to reduce a computational size of at least one of the fitted autoregressive input-output linear parameter-varying dynamic model and the fitted autoregressive input-output nonlinear parameter-varying dynamic model, a canonical variate analysis (CVA) between the corrected future outputs and past outputs of at least one of the fitted autoregressive input-output linear parameter-varying dynamic model and the fitted autoregressive input-output nonlinear parameter-varying dynamic model;
constructing at least one of a dynamic linear parameter varying state-space model and a dynamic nonlinear parameter varying state-space model based on the performed CVA;
generating a dynamic model of aircraft behavior; and
at least one of controlling and modifying aircraft dynamic response characteristics based upon the generated dynamic model of aircraft behavior, wherein the CVA is performed according to the equation:

$$y_t = \sum_{i=1}^{\ell} \alpha_i(\rho_{t-i} \otimes y_{t-i}) + \sum_{i=0}^{\ell} \beta_i(\rho_{t-i} \otimes u_{t-i}) + v_t$$

wherein $y_t$ is a linear prediction of a present output, $\alpha_i$ and $\beta_i$ are parameter-varying coefficients, $\rho_{t-i}$ is a parameter varying scheduling function, $y_{t-i}$ and $u_{t-i}$ are dimensions of identity matrices, t is time, $v_t$ is a white noise process of a covariance matrix, 1 is an order of the autoregressive input-output linear parameter-varying process.

14. A method of forming a dynamic model for the behavior of machines from sensed data, comprising observing, with at least one sensor, a vibrating structure in operation;

recording data from the at least one sensor about at least one characteristic of the vibrating structure in operation;

fitting at least one of an autoregressive input-output linear parameter-varying dynamic model and an autoregressive input-output nonlinear parameter-varying dynamic model, each model having a state order above a predetermined threshold, to the recorded vibrating structure data;

removing effects of future inputs from future outputs to generate corrected future outputs by using at least one of the fitted autoregressive input-output linear parameter-varying dynamic model and the fitted autoregressive input-output nonlinear parameter-varying dynamic model;

performing, to reduce a computational size of at least one of the fitted autoregressive input-output linear parameter-varying dynamic model and the fitted autoregressive input-output nonlinear parameter-varying dynamic model, a canonical variate analysis (CVA) between the corrected future outputs and past outputs of at least one of the fitted autoregressive input-output linear parameter-varying dynamic model and the fitted autoregressive input-output nonlinear parameter-varying dynamic model;

constructing at least one of a dynamic linear parameter varying state-space model and a dynamic nonlinear parameter varying state-space model based on the performed CVA;

generating a dynamic model of vibrating structure behavior; and at least one of controlling and modifying vibrating structure dynamic response characteristics based upon the generated dynamic model of vibrating structure behavior, wherein the CVA is performed according to the equation:

$$y_t = \sum_{i=1}^{\ell} \alpha_i(\rho_{t-i} \otimes y_{t-i}) + \sum_{i=0}^{\ell} \beta_i(\rho_{t-i} \otimes u_{t-i}) + v_t$$

wherein $y_t$ is a linear prediction of a present output, $\alpha_i$ and $\beta_i$ are parameter-varying coefficients, $\rho_{t-i}$ is a parameter varying scheduling function, $y_{t-i}$ and $u_{t-i}$ are dimensions of identity matrices, t is time, $v_t$ is a white noise process of a covariance matrix, 1 is an order of the autoregressive input-output linear parameter-varying process.

15. A method of forming a dynamic model for the behavior of machines from sensed data, comprising observing, with at least one sensor, an automobile suspension in operation;

recording data from the at least one sensor about at least one characteristic of the automobile suspension in operation;

fitting at least one of an autoregressive input-output linear parameter-varying dynamic model and an autoregressive input-output nonlinear parameter-varying dynamic model, each model having a state order above a predetermined threshold, to the recorded automobile suspension data;

removing effects of future inputs from future outputs to generate corrected future outputs by using at least one of the fitted autoregressive input-output linear parameter-varying dynamic model and the fitted autoregressive input-output nonlinear parameter-varying dynamic model;

performing, to reduce a computational size of at least one of the fitted autoregressive input-output linear parameter-varying dynamic model and the fitted autoregressive input-output nonlinear parameter-varying dynamic model, a canonical variate analysis (CVA) between the corrected future outputs and past outputs of at least one of the fitted autoregressive input-output linear parameter-varying dynamic model and the fitted autoregressive input-output nonlinear parameter-varying dynamic model;

constructing at least one of a dynamic linear parameter varying state-space model and a dynamic nonlinear parameter varying state-space model based on the performed CVA;

generating a dynamic model of automobile suspension behavior; and at least one of controlling and modifying automobile suspension dynamic response characteristics based upon the generated dynamic model of automobile suspension behavior, wherein the CVA is performed according to the equation:

$$y_t = \sum_{i=1}^{\ell} \alpha_i(\rho_{t-i} \otimes y_{t-i}) + \sum_{i=0}^{\ell} \beta_i(\rho_{t-i} \otimes u_{t-i}) + v_t$$

wherein $y_t$ is a linear prediction of a present output, $\alpha_i$ and $\beta_i$ are parameter-varying coefficients, $\rho_{t-i}$ is a parameter varying scheduling function, $y_{t-i}$ and $u_{t-i}$ are dimensions of identity matrices, t is time, $v_t$ is a white noise process of a covariance matrix, 1 is an order of the autoregressive input-output linear parameter-varying process.

* * * * *